United States Patent [19]
Takamori et al.

[11] Patent Number: 6,043,653
[45] Date of Patent: Mar. 28, 2000

[54] MAGNETIC RESONANCE IMAGING SYSTEM HAVING MECHANICALLY DECOUPLED FIELD GENERATORS TO REDUCE AMBIENT ACOUSTIC NOISE

[75] Inventors: Hiromitu Takamori; Ayumi Katsunuma, both of Otawara; Yasuhiro Uosaki, Nasu-Gun; Takeshi Toyoshima, Yokohama; Kazuhiro Iinuma, Nasu-Gun; Hiromi Kawamoto, Yaita; Hitoshi Yamagata, Otawara, all of Japan

[73] Assignee: Kabushiki Kaisha Toshiba, Kawasaki, Japan

[21] Appl. No.: 08/951,631

[22] Filed: Oct. 16, 1997

[30] Foreign Application Priority Data

Oct. 17, 1996 [JP] Japan .................................. 8-274609

[51] Int. Cl.$^7$ ........................................................ G01V 3/00
[52] U.S. Cl. .......................... 324/309; 324/318; 324/300
[58] Field of Search .................................... 324/318, 322, 324/309, 319, 300

[56] References Cited

U.S. PATENT DOCUMENTS 5,489,848  2/1996  Furukawa .
5,793,210  8/1998  Pla et al. ................................. 324/318

FOREIGN PATENT DOCUMENTS

| 59-174746 | 10/1984 | Japan . |
| 63-246146 | 10/1988 | Japan . |
| 2-147049 | 6/1990 | Japan . |
| 3-268743 | 11/1991 | Japan . |
| 6-189932 | 7/1994 | Japan . |

*Primary Examiner*—Christine K. Oda
*Assistant Examiner*—Brij B. Shrivastav
*Attorney, Agent, or Firm*—Nixon & Vanderhye P.C.

[57] ABSTRACT

Solid-borne vibrations and airborne vibrations from a gradient coil unit in an MRI gantry environment are markedly reduced thereby reducing ambient noise occurring due to the vibrations. Support assemblies retain the gradient coil unit in a mechanically-uncoupled or substantially-uncoupled state relative to the magnet by supporting the coil unit at separate positions on the floor (e.g., with anchor bolts rigidly coupling coil support assemblies to the floor). Moreover, the gradient coil unit and at least parts of the support assemblies may be retained in a vacuum space.

49 Claims, 14 Drawing Sheets

MAGNETIC RESONANCE IMAGING SYSTEM HAVING MECHANICALLY DECOUPLED FIELD GENERATORS TO REDUCE AMBIENT ACOUSTIC NOISE

BACKGROUND OF THE INVENTION

1. Field of the Invention

The prevent invention relates to a magnetic resonance imaging (MRI) system for medical diagnosis and a noise insulating method to be implemented in the system. More particularly, this invention is concerned with greatly suppressing noises derived from the pulsating drive of a gradient coil unit and with a noise insulating method to be implemented in the MRI system.

2. Description of the Related Art

A magnetic resonance imaging system for medical diagnosis is an imaging system utilizing a magnetic resonance phenomenon exhibited by nuclear spins in a subject body. The magnetic resonance imaging system is non-invasive and can produce images of the inside of a subject in the absence of exposure to X rays. The usefulness of the magnetic resonance imaging system even in clinical practice has been proven.

In general, a magnetic resonance imaging system for producing MR images comprises a gantry having a diagnostic space in which a subject is inserted and positioned, and a main unit interlocked with the gantry. The gantry is provided with various components, e.g., a magnet for generating a static magnetic field in the diagnostic space, such as, a superconducting magnet, a gradient coil unit for generating linear magnetic field gradients to be supposed on the static magnetic field, and a radio-frequency (RF) coil for transmitting a radio-frequency signal and receiving an MR signal are indispensable. For scanning, the magnet, gradient coil unit, and RF coil are driven according to a desired pulse sequence. Namely, linear magnetic field gradients changing in strength in x-axis, y-axis, and z-axis directions are superposed on a subject lying in the static magnetic field. Nuclear spins in the subject are excited magnetically by a radio-frequency signal at the Larmor frequency. A magnetic resonance (MR) signal produced by the excitation is detected. For example, a two-dimensional tomographic image of the subject is reconstructed on the basis of the signal.

In the above magnetic resonance imaging, the need to speed up imaging (i.e., to shorten the time required for imaging has increased in recent years. For coping with the need, an imaging technique using a pulse sequence including a gradient pulse to be switched (reversed) at a high speed; such as, fast echo planar imaging (EPI) has been developed. Some of these techniques have successfully been put to practical use. When a gradient pulse is generated, an electromagnetic force works on a gradient coil unit at the rise or reversal of the gradient pulse at audio frequencies. The electromagnetic force mechanically distorts the coil unit. This causes the whole unit to vibrate. There is a problem that acoustic vibrations occur with vibrations made by the coil unit and consequently loud acoustic noises occur. In particular, when a gradient pulse is reversed at high speed, a vibrations caused by application of the pulse are intensified. From this viewpoint, as imaging is speeded up, induced acoustic noises are intensified. The noises may give a subject (patient) lying down in the diagnostic space of the gantry a great sense of discomfort or unease.

Several proposals have been made in an effort to eliminate such noises in the past. As described in, for example. Japanese Unexamined Patent Publication Nos. 59-174746, 63-246146, 3-268743, and 6-189932 (hereinafter, the first to fourth prior arts), the whole unit of gradient coils in sealed in a vacuum container in order to discontinue acoustic propagation of vibrations or noises by utilizing a vacuum space.

However, the foregoing known anti-noise measures still have unsolved problems as described below.

The first to fourth prior arts have proposed a structure in which a gradient coil unit is merely enclosed with a vacuum space. A container and covers defining the vacuum space are mechanically connected to the cover and housing of a magnet for generating a static magnetic field, and the gradient coil unit itself is supported by the container and cover of the magnet for generating a static magnetic field. Part of the vibrations (noises) stemming from the gradient coil unit is cut off by the vacuum space but another part of the vibrations propagates along supporting units for supporting the gradient coil unit and reaches the magnet for generating a static magnetic field. The magnet for generating a static magnetic field thus also vibrates due to the vibrations made by the gradient coil unit. This poses a problem in that the whole of a gantry then serves as a source of acoustic vibrations to cause loud noises. That is to say, the known measures of enclosing the gradient coil unit within a vacuum are imperfect for suppressing noises.

SUMMARY OF THE INVENTION

The present invention attempts to solve these unsolved problems. The first object of the present invention is to successfully suppress noises (vibrations) from the whole gantry by markedly reducing solid-borne vibrations steaming from a gradient coil unit when a magnetic resonance imaging system is driven.

The second object of the present invention is to provide a less noisy magnetic resonance imaging system in which noises (vibrations) in the whole gantry are suppressed to a very low level by markedly reducing solid-borne vibrations stemming from a gradient coil unit when the magnetic resonance imaging system is driven and by cutting off airborne vibrations stemming from the gradient coil unit at the same time.

For accomplishing the above objects, according to the first aspect of the present invention, a magnetic resonance imaging system has a gantry including static field generating means for generating a static magnetic field in a scanning area in a diagnostic space, gradient generating means for generating magnetic field gradients in the scanning area, supporting means for retaining the gradient generating means in a mechanically uncoupled or substantially uncoupled state relative to the static field generating means and supporting the gradient generating means above an installation place, and vacuum space creating means for defining a closed space around at least the gradient generating means and bringing the closed space to a vacuum state. The magnetic resonance imaging system is characterized in that noises derived from drive of the gradient generating means are suppressed.

Aerial propagation of vibrations stemming from a gradient coil unit serving as the gradient generating means is blocked by the surrounding vacuum space. Moreover, solid propagation of the vibrations to a magnet serving as the static field generating means or any other component is suppressed. Noises (vibrations) occurring in the gantry are therefore reduced markedly.

Preferably, coupling means for rigidly coupling the supporting means to the installation place is included. Owing to the inclusion of the coupling means, vibrations stemming from the gradient coil unit serving as the gradient generating means are transmitted reliably to the floor that is the installation place via the supporting means. As a result, a mass effect exerted by the floor can be utilized effectively. The floor attenuates propagated vibrations. Noises are therefore minimized more reliably.

According to the second aspect of the present invention, a magnetic resonance imaging system has a gantry including static field generating means for generating a static magnetic field in a scanning area in a diagnostic space, first supporting means for supporting the static field generating means while resting at a position on an installation place, gradient generating means for generating magnetic field gradients in the scanning area, second supporting means for retaining the gradient generating means in a mechanically uncoupled or substantially uncoupled state relative to the generating means and supporting the magnetic field gradient generating means while resting at a position different from the position on the installation place, and coupling means for rigidly coupling the gradient supporting means to the installation place. The magnetic resonance imaging system in characterized in that noises derived from drive of the gradient generating means are suppressed.

Preferably, the static field generating means is a magnet, and the gradient generating means is a gradient coil unit composed of x gradient coils, y gradient coils, and z gradient coils. For example, the coupling means is setscrews for rigidly coupling the supporting means to the rigid floor that is the installation place.

In the magnetic resonance imaging system according to the second aspect, the gradient coil unit and magnet are supported mechanically separately by the static field and gradient supporting means. Vibrations made by the gradient coils are propagated to the floor via the coupling means and absorbed owing to a mass effect exerted by the floor. As a result, the vibrations of the gradient coil unit are actively attenuated. Moreover, the propagation of the vibrations to the magnet is suppressed, Consequently, noises in the whole gantry can be reduced.

Further advantages of the invention will become apparent upon reading and understanding the following detailed description of the preferred embodiments.

BRIEF DESCRIPTION OF THE DRAWINGS

In the accompanying drawings only for illustrative purposes.

DESCRIPTION OF THE PREFERRED EMBODIMENTS

Embodiments of the present invention will be described in conjunction with the appended drawings.

(First Embodiment)

A magnetic resonance imaging system in accordance with the first embodiment will be described in conjunction with FIGS. 1 to 3.

Figure 1:
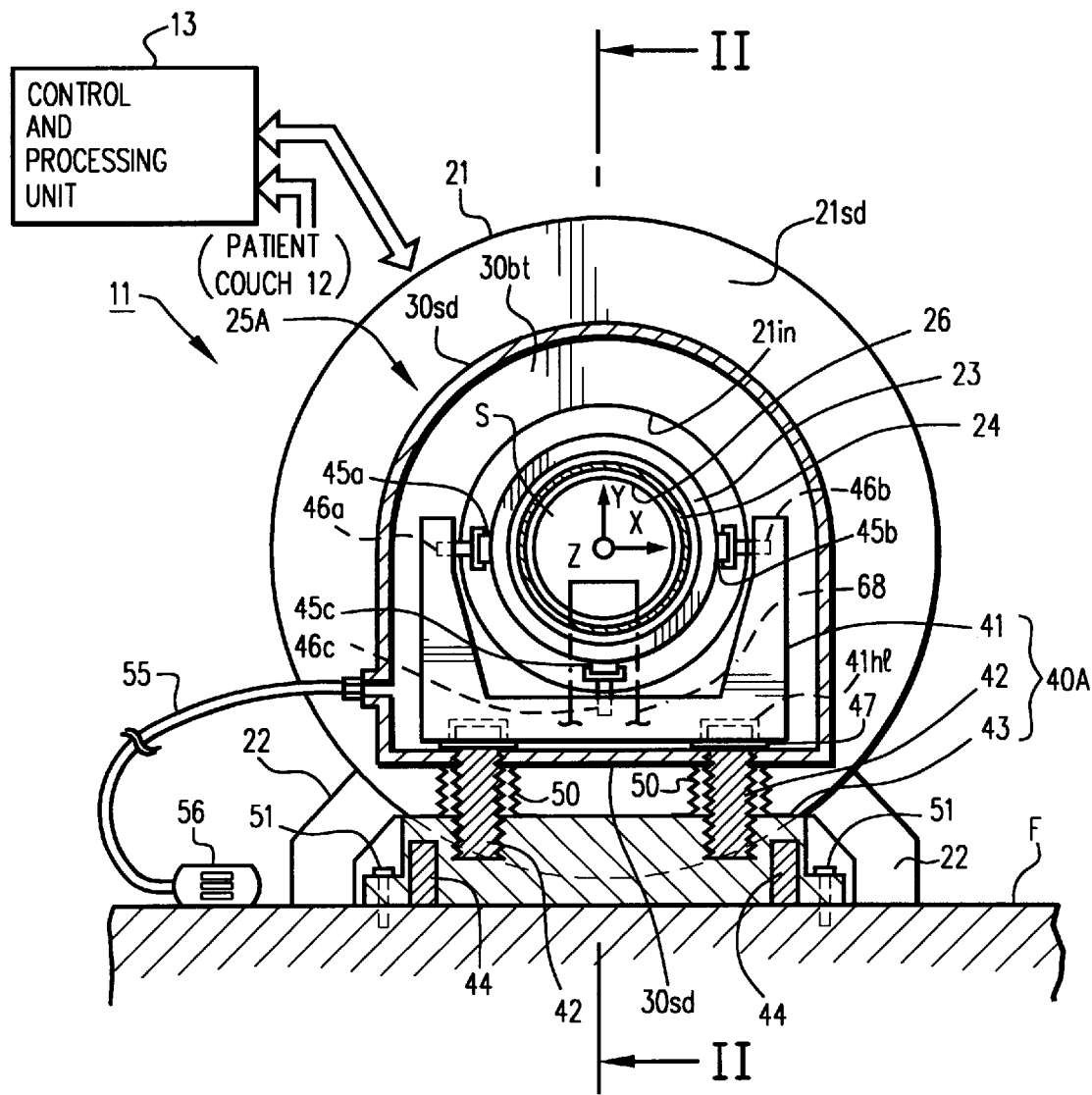
FIG. 1 is a partly-perspective front view showing the structure of a gantry of a magnetic resonance imaging system in accordance with the first embodiment of the present invention.
Figure 2:
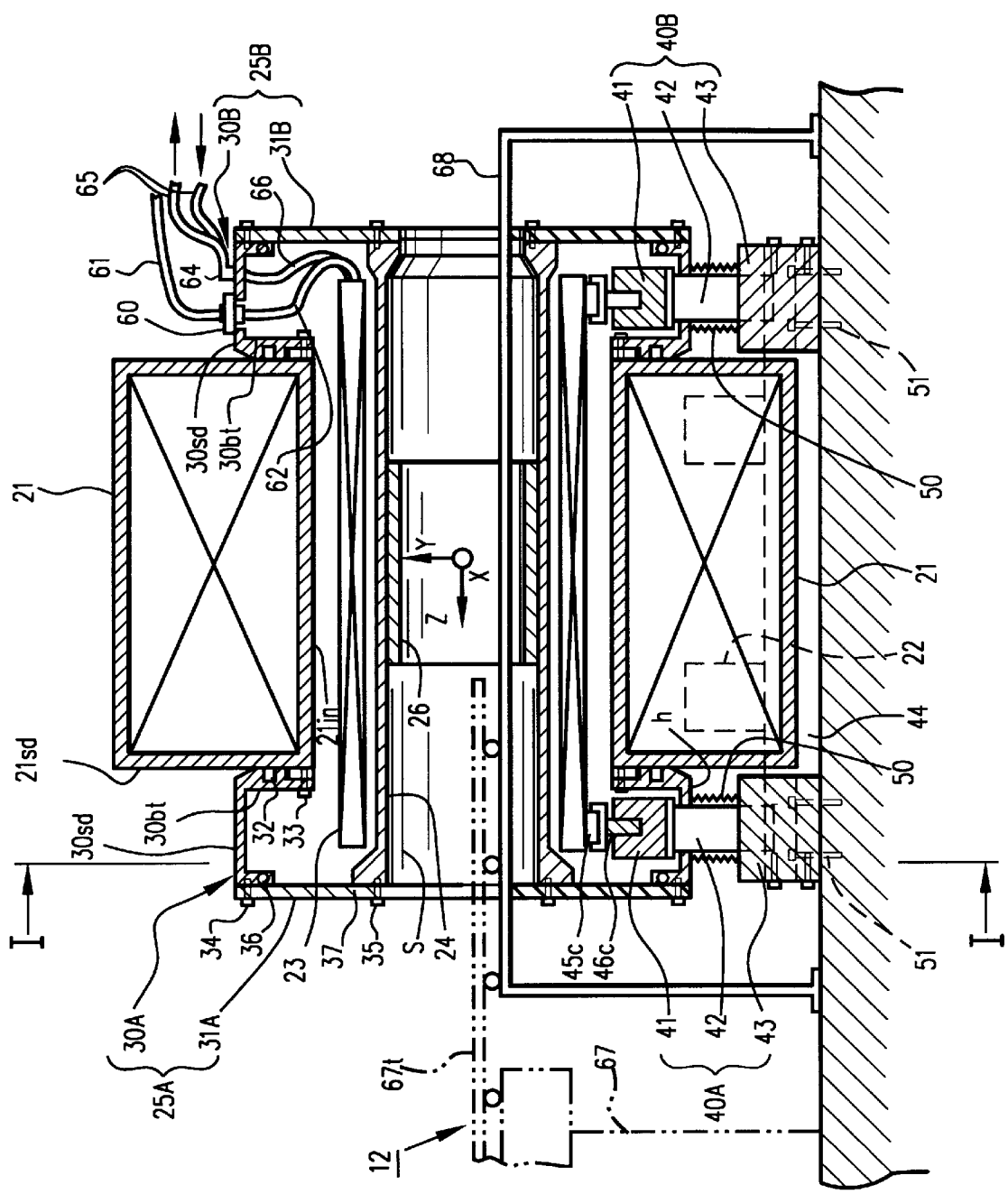
FIG. 2 is a schematic sectional view of the gantry along an II—II line in FIG. 1 showing the structure of the gantry.

The magnetic resonance imaging system comprises, as shown in FIGS. 1 and 2, a gantry 11 having a diagnostic space in which a patient is inserted and positioned for diagnosis, a patient couch 12 (See FIG. 2) located adjacent to the gantry 11, and a control and processing unit 13 for controlling the operations of the gantry 11 and patient couch 12 and processing a received MR signal. The gantry 11 has a substantially cylindrical diagnostic space S, into which a patient is inserted and positioned, in the internal center bore thereof. The axial direction of the cylindrical diagnostic space S is defined as a Z-axis direction, and X-axis and Y-axis directions orthogonal to the Z-axis direction are defined as illustrated.

The gantry 11 includes a magnet 21 for generating a static magnetic field in the diagnostic space S defined inside. The magnet 21 is, for example, a superconducting magnet. The whole magnet 21 in shaped like a cylinder having a bore 21$br$ that has a given diameter. The magnet 21 includes a total of four legs 22 coupled as integral parts to an outer circumference of the magnet 21 and located in pairs at both ends in the center-axis direction (Z-axis direction) of the magnet 21. Owing to the legs 22, the magnet 21 is supported above a floor F that is an installation place. The floor F is made of a highly rigid material, for example, concrete.

Located in the bore 21$br$ of the magnet 21 is a structure having a gradient coil unit 23 retained in a vacuum closed state. The structure is, as illustrated, composed of an inner cylinder 24 made of a nonmagnetic material and having a given diameter smaller than the diameter of the bore 21$br$, and vacuum covers 25A and 25B made of a nonmagnetic material for closing the space defined between the magnet 21 and inner cylinder 24 at both ends in the Z-axis direction.

The inner cylinder 24 is designed to preserve the diagnostic space S in the bore 21$br$ of the magnet 21 and hold a radio-frequency (RF) coil 26 on the inner circumferential surface thereof, and placed coaxially with the magnet 21 inside the bore 21*br*. The RF coil 26 is a whole body transmission coil. The vacuum covers 25A and 25B are, as shown in FIG. 2, composed of flanges 30A and 30B respectively to be attached to the flank 21*sd* of the magnet 21 and vacuum end plates 31A and 31B respectively for coupling the inner cylinder 24 to the flanges 30A and 30B respectively, whereby the efficiency in assembling the vacuum covers is improved.

The flanges 30A and 30B are each composed of a bass member 30*bt* formed by uniting a semi-torus-like upper part and a substantially U-shaped lower part having angular part at both lower corners, and a side member 30*sd* rising perpendicularly from the outer circumferential and of the base member 30*bt* as an integral part thereof. The sections in the axial direction of the flanges are shaped substantially like letter L. The flanges 30A and 30B have the inner circumferential surfaces of the base members 30*bt* (height in a radial direction on the XY place) even with an inner-circumferential surface 21*in* of the magnet 21, and are fixed to the flanks 21*sd* of the magnet 21 via O rings 32 serving as vacuum sealing members attached to the bass members 30*bt* by tightening setscrews 33 such as bolts. The flanks 21*sd* of the magnet 21 are formed perpendicularly to the center axis (Z axis) of the magnet 21. The positions of the flanges 30A and 30B can be adjusted by sliding the base members 30*bt* vertically (Y-axis direction) or laterally (X-axis direction) on the flank 21*sd*. The flanges 30A and 30B can be filed at intended positions using the setscrews 33.

The vacuum and plates 31A and 31B are fixed to the ends of the side members 30*sd* of the flanges; 30A and 30B and to the ends of the inner cylinder 24 using setscrews 34 and 35 such as bolts. O rings 36 and 37 are, as illustrated, interposed between the vacuum end plates and the side members and between the vacuum end plates and the inner cylinder which are brought into contact by the fixing. The positions of the O rings 36 interposed between the vacuum end plates 31A and 31B and flanges 30A and 30B can be adjusted in a direction orthogonal to the center-axis (Z-axis) direction. Owing to this structure, a closed space CS is defined by the inner cylinder 24, the vacuum covers 31A and 31B, and the inner circumferential surface 21*in* of the magnet 21, which shall be referred to as defining members inside the bore 21*br* of the magnet 21. The position in vertical or lateral directions of the inner cylinder 24 defining part of the closed space CS can be changed by finely adjusting the relative positions between the flanges 30A and 30B and the flank 21*sd* of the magnet 21. Thus, the center-axis position of the diagnostic space S can be adjusted.

In the closed space CS, the gradient coil unit 23 is placed in non-contact with the defining members. The gradient coil unit 23 is composed of x gradient coils, y gradient coils, and z gradient coils which are windings layered and impregnated on a bobbin, and are shaped lie a cylinder as a whole. The gradient coil unit 23 may be of a non-shielded type or shielded type.

The gradient coil unit 23 is located in the closed space CS and supported above the floor F by support assemblies 40A and 40B, which serve as a supporting means, located at both ends in the Z-axis direction of the magnet. The support assemblies 40A and 40B are each composed of a support member 41 for holding the gradient coil unit 23 at three points in the closed space CS, two rods 42 for supporting the support member 41, and a base 43 on which the rods 42 are resting. Two beams 44 are placed for linking the bases 43 at both ends in the Z-axis direction. The support assemblies 40A and 40B are made preferably of an aluminum material, stainless material, or an alloy of the aluminum or stainless material with lead and/or brass so that the support assemblies will exhibit high rigidity. Thus, vibrations propagated from the gradient coil unit 23 to the support assemblies 40A and 40B can be transmitted to the floor efficiently.

The support members 41 each are a square bar shaped substantially like a bracket, and have a three-point holding structure in which the distal end positions of a support member hold the horizontally side positions of the gradient coil unit 23, and the lower center position of the support member holds the vertically lower position of the gradient coil unit 23.

At the catching positions of the support members 41, the gradient coil unit 23 is supported by setscrews 46*a*, 46*b*, and 46*c* which are structured to be screwed and whose positions can be adjusted with elastic members 45*a*, 45*b*, and 45*c* made of rubber or the like between the support member and setscrews. The first elastic members 45*c* placed at the vertically lower positions of the gradient coil unit 23 exert a repulsion to support the gradient coil unit 23, and the second elastic members 45*a* and 45*b* placed at the horizontally side positions thereof exert a repulsion to support the gradient coil unit 23. By adjusting the degree of screwing the setscrews 46*a* and 46*b* for supporting the horizontally side positions of the gradient coil unit 23, the horizontal position of the gradient coil unit can be adjusted. By adjusting the degree of screwing the setscrews 46*c* for supporting the vertically lower positions of the gradient coil unit, the vertical position of the gradient coil unit can be adjusted. Consequently, the horizontal position and vertical position of the gradient coil unit 23 can be adjusted by adjusting the degrees of screwing the setscrews 46*a*, 46*b*, and 46*c*.

The first elastic members 46*c* and setscrews 46*c* for holding the vertically lower positions of the gradient coil unit at both ends in the Z-axis direction thereof bear the load of the gradient coil unit 23. The elastic constant of the first elastic members 45*c* located immediately under the gradient coil unit is set to a sufficiently larger value than that of the second elastic members 45*a* and 45*b* placed at the horizontally side positions The first elastic members 45*c* located immediately under the gradient coil unit are therefore designed to reduce vibrations stemming from the gradient coil unit 23 while bearing the total load and to reduce solid-borne vibrations of the support assemblies 40A and 40B. The elastic constant of the second elastic members 45*a* and 45*b* placed at the vertically lower positions is so small that solid-borne vibrations propagating from the gradient coil unit 23 to the support assemblies 40A and 40B can be reduced reliably.

The supported positions or the positions at which the gradient coil unit 23 is supported by the combinations of the first elastic numbers 45*c* bearing the total load of the gradient coil unit 23 and the setscrews 46*c* are not necessarily limited to the illustrated vertically lower positions or lowest positions, but may be lower positions near the vertically lower positions or side positions. The supported positions are shifted from the vertically lower positions to positions in the lateral directions (side positions), the gradient coil unit 23 is supported with shearing stresses proportional to the shift from the vertically lower positions. The elastic constant of the first elastic members 45*c* should preferably be adjusted accordingly.

Furthermore, the two rods 42 and 43 located at given positions of both ends of each support member have the ability to support each support member 41 in a vertical direction (Y-axis direction). The upper ends of the rods 42 are fitted into holes 41*hl* bored in the support member 41 and fixed by hexagon nuts 47. The holes 41*hl* bored in the support member 41 are so-called "fool holes." By adjusting heights and positions at which the hexagon nuts 47 are tightened, the horizontal and vertical positions of the support member can be adjusted. By thus adjusting each support member, the horizontal and vertical positions of the gradient coil unit 23 can be adjusted. The lower ends of the rods 42 are loosely inserted into holes h bored in the bottoms of the side members 30*sd* of the flanges 30A and 30B, extended downward, and then rigidly coupled to the bases 43 while being screwed up.

The portions of the rods between the bases 43 and the holes h of the side members 30*sd* are sealed with vacuum bellows 50 that are vacuum-proof members with small rigidity. The vacuum bellows 50 and bases 43 are in non-contact with one another. The aforesaid closed space CS will therefore not communicate with the external world via the holes h and remains perfectly closed. The vacuum bellows 50 are made of a material with small rigidity so that they can enjoy the ability to seal the rods as well as the ability to suppress vibrations propagating to the vacuum covers 30A and 30B through the support assemblies 40A and 40B. The vacuum bellows 50 may be rubber bellows or may be replaced with rubber covers.

The bases 43 are, as shown in FIG. 2, stepped at both ends thereof in the X-axis direction. The bases 43 are rigidly coupled to the floor F by tightening anchor bolts 51 at the positions of the steps. The anchor bolts 51 serve as a coupling means for rigidly coupling the supporting means of the present invention to the installation place (floor). The anchor bolts 51 typical of the coupling means are used to attenuate vibrations propagating from the gradient coil unit 23 through the support assemblies 40A and 40B by utilizing (absorbing) the mass of the floor F which is much heavier than the gradient coil unit 23.

The beams 44 are coupling members with a given length made of a highly rigid material such as a metal. The beams 44 are placed on the floor F, thus rigidly coupling the bases 43 in the Z-axis direction at both ends in the X-axis direction of the bases 43. Thus, the distance in the Z-axis direction between the bases 43 can be confined to a set value.

As shown in FIG. 1, an exhaust means for exhausting air from the closed space CS accommodating the gradient coil unit 23 is connected to one vacuum cover 25A. The exhaust means in composed of a vacuum-proof hose 55 linked to a given position of the side member 30*sd* of the flange 30A, and a vacuum pump 56, which is, for example, of a rotary type, linked to the hose 55. Thus, when the vacuum pump 56 it driven, the closed space CS cm be brought to a vacuum state defined with, for example, $1.01 \times 10^3$ to $10^8$ Pa.

Furthermore, as shown in FIG. 2, a mechanism for supplying power and a cooling medium to the gradient coil unit 23 through the vacuum cover 26B located an the opposite side of the gantry 11 relative to the patient couch 12. The vacuum cover 26B includes, as mentioned previously, the flange 30B and vacuum end plate 31B. A vibration insulation terminal 60 of a vacuum-proof type for preventing a discharge phenomenon is, as illustrated, attached airtightly to a given position of the side member 30*sd* of the flange 30B. An outer power cable 61 and inner power cable 62 are linked by the terminal 60. The terminal 60 functions as a relay for relaying power from a non-vacuum room to the vacuum space CS. The outer power cable 61 in linked to a gradient power supply (not shown) incorporated in the control and processing unit 13. The inner power cable 62 is placed in the closed space CS that is a vacuum space, and linked to the windings of the gradient coil unit 23. Over the inner power cable 62, a pulsed voltage of, for example, about ±2000 V supplied over the outer power cable 61 is supplied to the winding. For the inner power cable 62, vacuum-proof wires that are easily bendable and flexible are used for the purpose of reducing solid propagation of vibrations stemming from the gradient coil unit 23.

A two-port type coupler 64 of a vacuum-proof type is attached airtightly to another given position of the side member 30*sd* of the flange 30B. The coupler 64 functions as a relay for allowing a cooling medium (for example, water) for cooling the gradient coil unit 23 to go and return between the room and vacuum space CS. Two outer tubes 65 and two inner tubes 66 are linked by the coupler 64, thus forming incoming and outgoing paths. The outer tubes 65 are joined with a cooling medium supply source, for example, a tap. Vacuum-proof tubes having flexibility are used as the inner tubes 66. Therefore, solid propagation of vibrations stemming from the gradient coil unit 23 can be reduced reliably.

The other ends of the inner tubes 66 are joined with an entry and exit of a cooling tube (not shown) wound, for example, spirally inside the gradient coil unit 23. The cooling medium supplied over one outer tube 65 reaches the cooling tube through one inner tube 66, circulates through the cooling tube, and then returns to the cooling medium supply source through the other inner tube 66 and the other outer tube 65. Heat dissipated by driving the gradient coil unit 23 is therefore removed forcibly.

Furthermore, the patient couch 12 is placed in a diagnostic bore S of the gantry 11 in order to insert and position a patient therein. The patient couch 12 has, as shown in FIG. 2, a couch 67 located at a position facing the diagnostic space S. A patient lies down in a supine posture on a couchtop 67*t*. When the couchtop 67*t* slides, it advances gradually in the diagnostic space S. In this embodiment, a couchtop rail 68 is laid down in order to support the advancing couchtop 67*t* with the couchtop held slidable. The couchtop rail 68 is, as illustrated, formed with a plate shaped substantially like a bracket, having a given width, and made of a nonmagnetic material. The couchtop rail 68 has a slide aid portion thereof inserted in the diagnostic space S and is fixed to the floor F while being in non-contact with the inner cylinder 24 and vacuum covers 25A and 25B. In other words, the couchtop rail 68 is placed mechanically separately from and independently of the gantry 11, and structured to guide and support rollers of the couchtop 67*t* with the slide aid portion thereof that is a horizontal part thereof. In a known system, this kind of couchtop rail is fixed to part of the diagnostic bore.

Furthermore, the control and processing unit 13 comprises, as shown in FIG. 1, a console including an input unit and display unit, a control cabinet serving as a hub of control, a gradient power supply, radio-frequency amplifier, and reception amplifier operated under the control of the control cabinet, and a static power supply. The control and processing unit executes drive for acquisition of an MR signal according to a desired pulse sequence.

If necessary, an iron shim or shim coils for shimming inhomogeneity of a static magnetic field can be placed at a desired position in the gantry structure shown in FIGS. 1 and 2.

Next, the operation and advantages of the first embodiment will be described.

The vacuum pump 56 is actuated in order to exhaust the closed space CS surrounding the gradient coil unit 23. A vacuum state defined with a given value is thus created in the closed space CS. Moreover, a current is supplied from the static power supply to the magnet 21, and a static magnetic field is produced in the diagnostic space S including a scanning area. In this state, the patient lying down on the couchtop 67t is inserted into the diagnostic space S. At this time, the couchtop 67t is guided and supported by the couchtop rail 68 that is a unique constituent feature of this embodiment. Shimming is then carried out if necessary. After necessary preparations such as placement of a reception coil and positioning of a slice plane have been made, diagnosis is started. Specifically, the control and processing unit 13 issues control commands to the components of the gantry according to a desired pulse sequence, and receives an MR signal produced in the patient body. Based on the MR signal, image data is reconstructed.

In the driven state based on a pulse sequence, a pulsating current that rises or falls abruptly is applied to the gradient coil unit 23. In particular, when the pulse sequence is a pulse sequence for fast imaging, the pulsating current is quickly reversed in polarity. Since the gradient coil unit 23 is placed in the static magnetic field, every time the pulsating current makes a state transition quickly, an electromagnetic force is generated. The electromagnetic force causes mechanical deflections, that is, vibrations. The magnitude of the electromagnetic force varies in a complex manner depending on the positions of the x coils, y coils, and z coils. The gradient coil unit 23 therefore normally vibrates in a complex mode.

Even when the gradient coil unit 23 vibrates, since, in this embodiment, the gradient coil unit 23 is located in the vacuum space, it will not cause the air surrounding the gradient coil unit to vibrate. In other words, aerial propagation of vibrations indicated with arrows A1 in FIG. 3 is eliminated or reliably suppressed. Vibrations propagating outside can be markedly reduced.

By contrast, vibrations made by the gradient coil unit 23 are propagated by conduction via solids through the support assemblies 40A and 40B and liable to leak out. However, since various measures for absorbing or suppressing solid-borne vibrations are taken as mentioned previously, leaking vibrations become very weak.

Since the elastic members 45a, 45b, and 45c for supporting the gradient coil unit 23 on the sides and bottom of the gradient coil unit 23 are located at both ends in the Z-axis direction of the gradient coil unit 23, vibrations are absorbed as greatly as possible and propagation of vibrations to the support assemblies 40A and 40B is suppressed. Vibrations that cannot be removed by the elastic members propagate to the support assemblies 40A and 40B.

Figure 3:
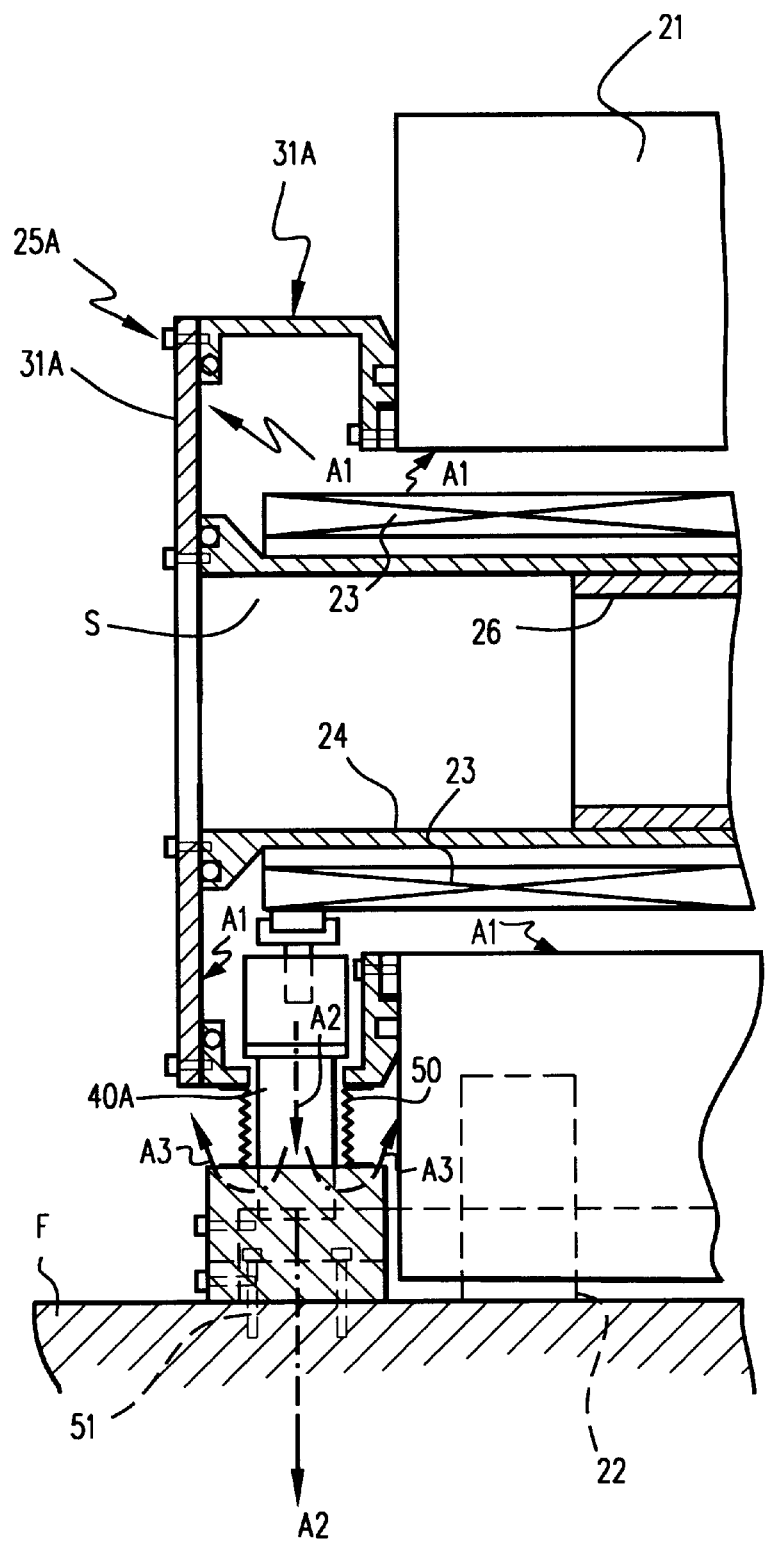
FIG. 3 is a diagram for explaining solid-propagation paths of vibrations through a support assembly.

Once vibrations are propagated to the support assemblies 40A and 40B, the vibrations are actively routed downward by the support members 41, rods 42, and bases 43 which are rigidly coupled (See an arrow A2 in FIG. 3). A majority of the thus routed vibrations is propagated to the floor F because the bases 43 are rigidly coupled to the floor F by the anchor bolts 51. The mass of the floor F is so large that the vibrations are attenuated reliably owing to the mass effect of the floor.

When vibrations propagate through the support assemblies 40A and 40B, the vibrations may be routed along paths indicated with arrows A3 in FIG. 3. In this embodiment, since the vacuum bellows 50 are used as members for linking the support assemblies 40A and 40B and the vacuum covers 25A and 25B and retaining the vacuum state of the closed space CS, the vibrations propagated to the vacuum covers 25A and 25B are weakened markedly. Even when the support assemblies 40A and 40B vibrate, the vibrations will hardly be propagated to the inner cylinder 24 and the components linked to the inner cylinder, and eventually to the magnet 21 for generating a static magnetic field. That is to way, almost all the components that may vibrate responsively to the vibrations of the support assemblies 40A and 40B are excluded.

Furthermore, almost all the outer surfaces of the support assemblies 40A and 40B except parts of the bases 43 are encircled with the vacuum space (closed space CS). Like the gradient coil unit 23, therefore, airborne vibrations that leak out are quite limited.

As mentioned above, according to the gantry structure of this embodiment, (1) aerial propagation of vibrations (that is, noises) stemming from the gradient coil unit itself that vibrates greatly and the support assemblies 40A and 40B can be blocked greatly owing to the vacuum space.

(2) the vibrations can be eliminated as greatly as possible by the elastic members interposed between the support assemblies 40A and 40B and the gradient coil unit 23, (3) the remaining vibrations can be actively evacuated to the floor and attenuated owing to the mass effect of the floor, and thus noises can be reduced, and (4) almost all the vibrations propagating to the magnet and couchtop rail can be eliminated owing to the combined effect of individual support of the gradient coil unit 23, magnet 21, and couchtop rail 68, flexible hold of the power cable and cooling tube, and suppression of vibrations by the floor F and vacuum bellows 50, objects that may be vibrated can be reduced in number, and eventually noises can be minimized. Since the solid-propagation path is extended to the floor, an effect of vibration reduction can be expected in the course of propagation Assuming, that a driven state is the same, unlike various gantry structures disclosed in patent publications or a gantry structure in which a gradient coil unit and a magnet for generating a static magnetic field are supported mechanically separately, even when a pulse sequence for fast imaging is used, vibrations and noises derived from vibrations made by the gradient coil unit itself can be minimized drastically. Consequently, a sense of unease or discomfort to be given to a patient because of the noises (vibrations) can be nullified successfully.

In additions since facilities for adjusting the position of the center axis of the diagnostic space S and for adjusting the position of the gradient coil unit 23 are, as mentioned previously, placed at various positions, the gantry structure of this embodiment has the merit of easy assembly, maintenance, and inspection.

According to the present inventions a structure in which no vacuum space is created around the outer circumferences of the gradient coil unit and support assemblies but, like the aforesaid gantry structure, the magnet 2 and gradient coil unit 23 are supported separately and the support assemblies 40A and 40B are rigidly coupled to the floor by the anchor bolts 51 can be adopted. Compared with a known structure in which a magnet and gradient coil unit are merely supported separately, this structure will prove effective in reducing overall noises because the operation of vibration attenuation due to the mass affect of the floor can be actively utilized.

In the aforesaid gantry structure, an elastic member may me interposed between each base 43 and the floor F in order to absorb vibrations propagating through solid-state members more efficiently. In this case, the anchor bolts 51 may or may not be employed. Even when the anchor bolts 51 are not employed, a solid-propagation path along which vibrations propagate from the gradient coil unit 23 to the magnet 2 or inner cylinder 24 is detoured to be routed to the floor via the support assemblies 40A and 40B, or made longer. The vibrations reaching the magnet 21 or inner cylinder 24 are therefore weakened. Moreover, the vibrations or noises can be reduced owing to an effect of vibration attenuation exerted in the course of the routing.

In the aforesaid structure, the terminal for the power cables and/or the coupler for the cooling tube, which work as a relay, may be attached airtightly to part of a support assembly, for example, the base thereof but not to the aforesaid vacuum cover. In this case, the power cables and cooling tube are routed to the gradient coil unit through a passage linking a base, rod, and support member.

Furthermore, an a cooling structure for cooling the gradient coil unit 23, numerous cooling pipes may be juxtaposed, wound spirally, and hardened cylindrically using a resin.

(Second Embodiment)

A magnetic resonance imaging system in accordance with the second embodiment will be described in conjunction with FIG. 4 and 5. In the description below, the same reference numerals will be assigned to components identical or similar to those in the first embodiment. The description of the components will be omitted (the same applies to subsequent embodiments).

An object of the magnetic resonance imaging system of this embodiment is to achieve a marked reduction of noises and to simplify a structure for reducing noises ax greatly as possible.

Figure 4:
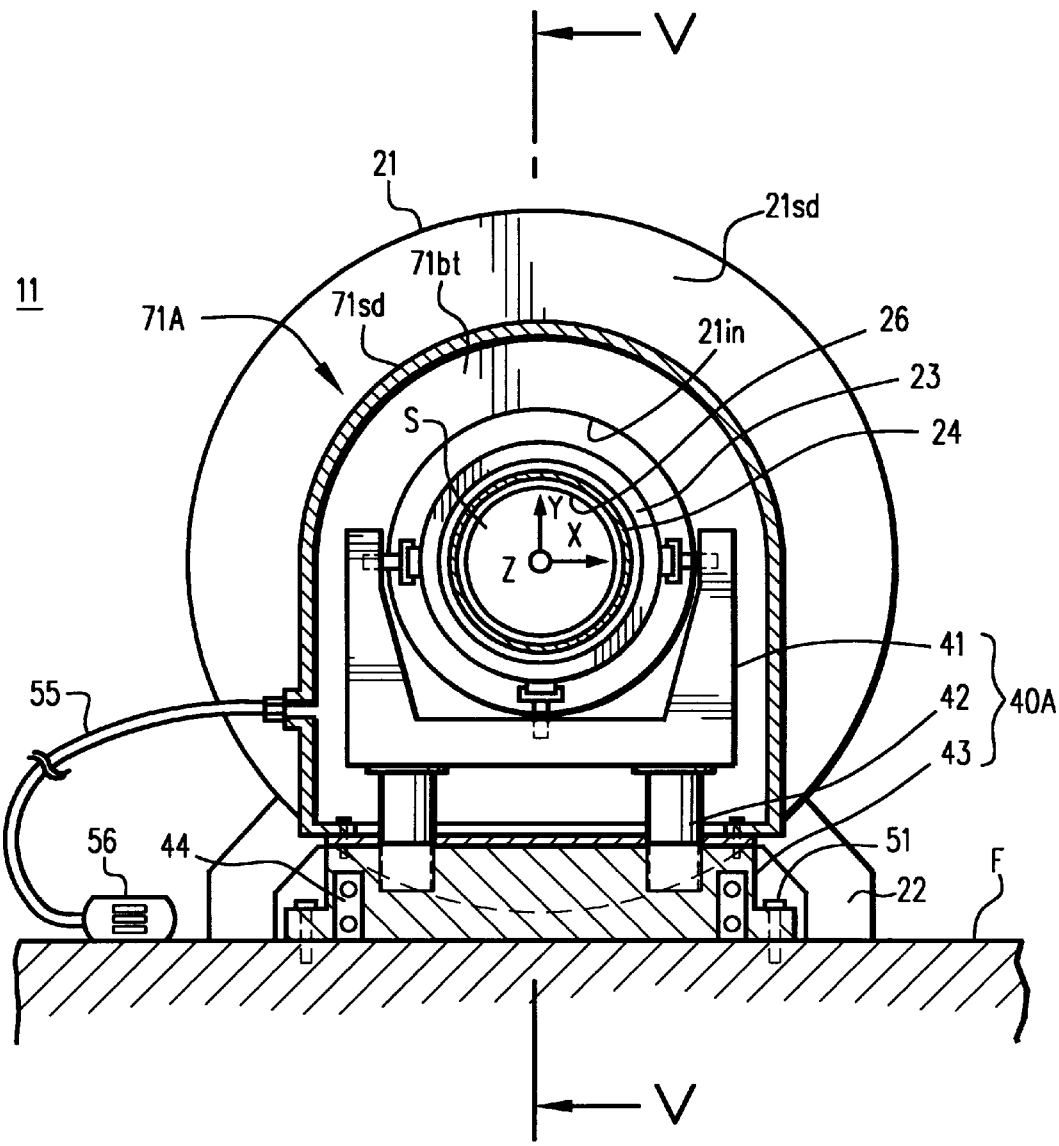
FIG. 4 is a partly-perspective front view showing the structure of a gantry of a magnetic resonance imaging system in accordance with the second embodiment of the present invention.
Figure 5:
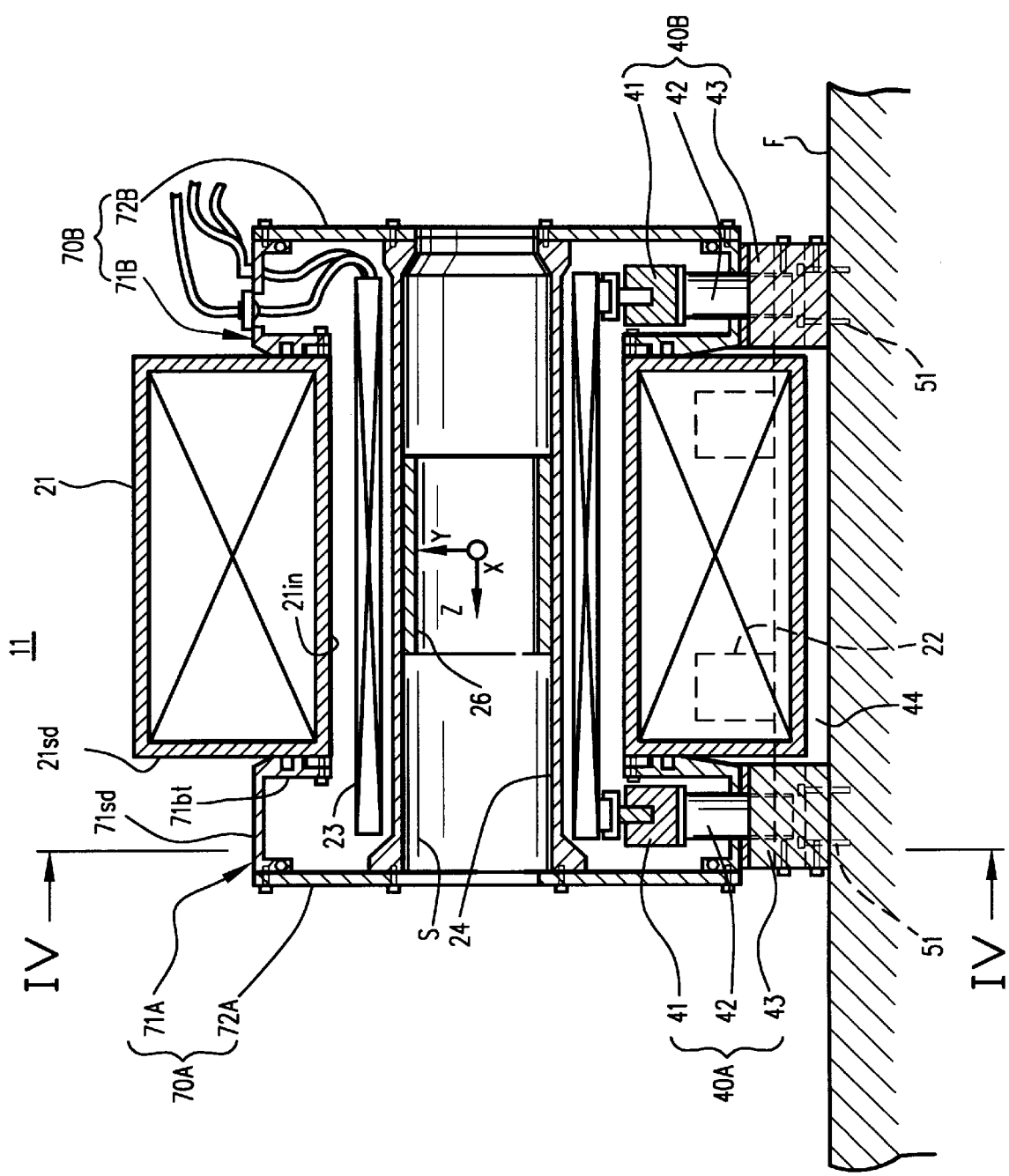
FIG. 5 is a schematic sectional view of the gantry along a V—V line in FIG. 4 showing the structure of the gantry.

FIGS. 4 and 5 show the structure of the gantry 11 alone of the magnetic resonance imaging system. The gantry 11 has substantially the same structure as the one in the first embodiment but is different in the structure of a vacuum cover.

The gantry 11 has at both ends in the Z-axis direction thereof vacuum covers 70A and 70B for sealing a space defined by the inner cylinder 24 and magnet 21 for generating a static magnetic field. The vacuum covers 70A and 70B are, like the corresponding ones in the first embodiment, composed of flanges 71A and 71B and vacuum and plates 72A and 72B. The flanges 71A and 71B arm each composed of a base member 71*bt* and side member 71*sd* which are formed as a united part whose section in the axial direction are shaped like a letter L. The base members 71*bt* are attached airtightly to the flanks 2*sd* of the magnet 21, and the side members 71*sd* are coupled airtightly to the vacuum end plates 72A and 72B.

The vacuum end plates 72A and 72B, base members 71*bt* and side members 71*sd* are longer in the direction of the skirts of the vacuum covers (vertically or in the Y-axis direction) than the corresponding members in the first embodiment. The ends of these members are bent inward or the members have bent ends, and the ends arm fixed airtightly to the bases 43 with vacuum sealing members between the members and bases. Thus, the closed space CS accommodating the upper parts of the support assemblies 40A and 40B above the bases 43 thereof and the gradient coil unit 23 can be sealed. In this embodiment, the vacuum bellows linking the vacuum covers and support assemblies, which are employed in the first embodiment are unnecessary.

The other components are identical or similar to those of the system of the first embodiment.

Although solid-borne vibrations propagating from the support assemblies 40A and 40B to the vacuum covers 70A and 70B remain intact, absorption works effectively owing to an effect of vibration absorption exerted by the elastic members of the support assemblies 40A and 40B and a mass effect exerted by the floor F to which the support assemblies 40A and 40B are rigidly coupled. Components that vibrate especially greatly, such as, the gradient coil unit 23 and support assemblies 40A and 40B are thus prevented from vibrating as a top priority. Noises derived from the vibrations made by the gradient coil unit 23 can be reduced more greatly than they are in the known systems. Moreover, the configuration of the system can be simplified because the vacuum bellows can be excluded.

[First Variant]

A variant of the second embodiment will be described in conjunction with FIGS. 6 and 7. A gantry of a magnetic resonance imaging system of this variant has a supporting means shared by a gradient coil unit and a magnet for generating a static magnetic field.

Figure 6:
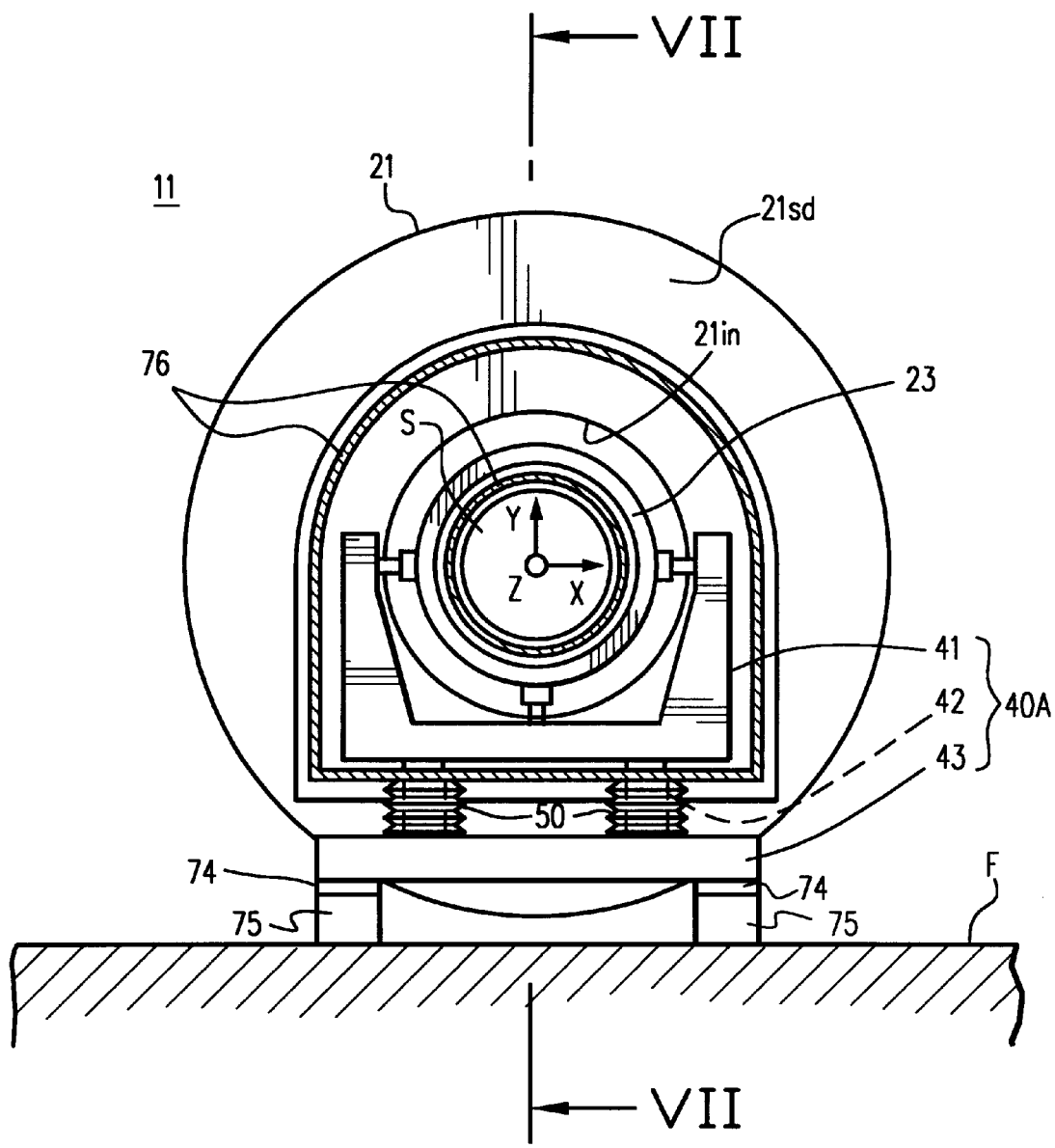
FIG. 6 is a partly-perspective front view showing the structure of a gantry of a magnetic resonance imaging system in accordance with the first variant.
Figure 7:
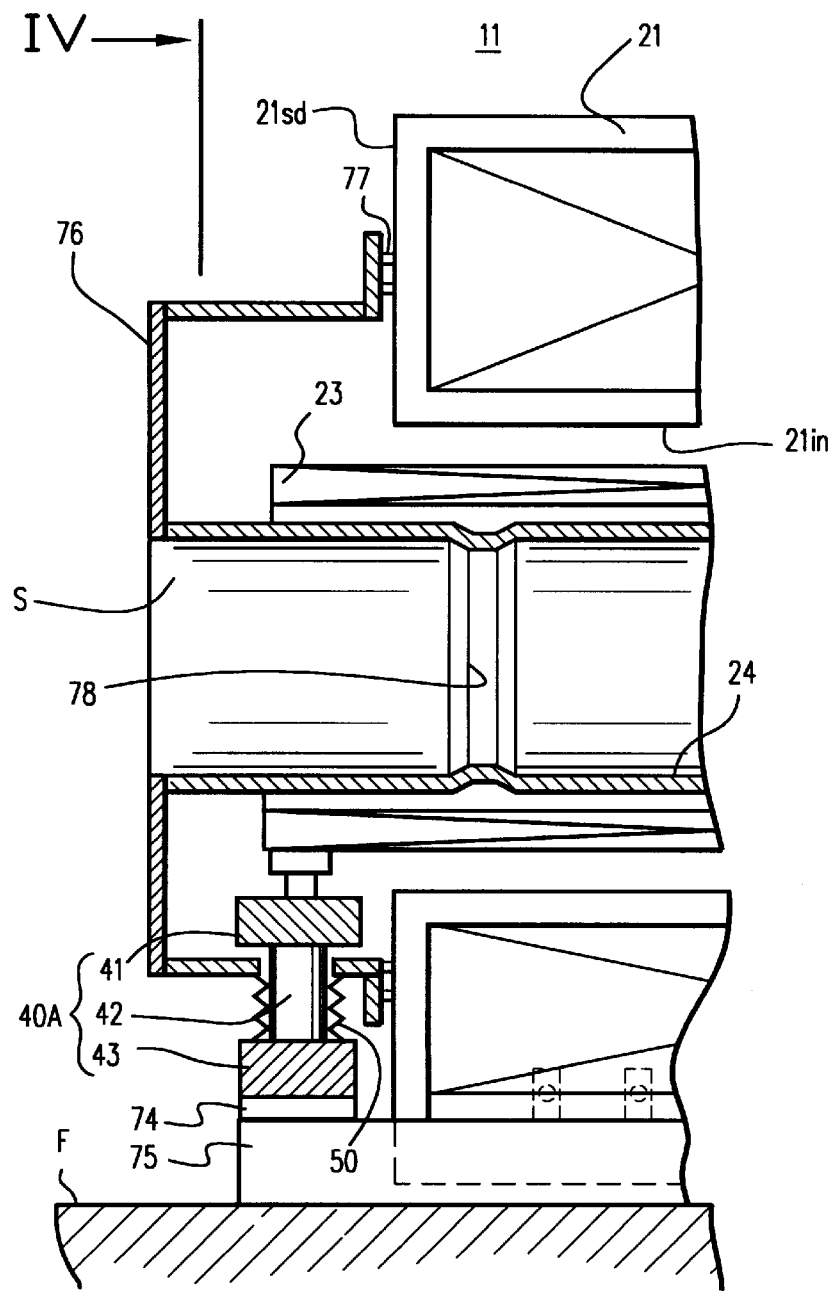
FIG. 7 is a schematic sectional view of the gantry along a VII—VII line in FIG. 6 showing the structure of the gantry.

As shown in FIGS. 6 and 7, a support assembly 40A is included for supporting the gradient coil unit 23 (the same support assembly is installed at the opposite and in the Z-axis direction of the gradient coil unit 23 in the same manner). The support assembly 40A is placed on two rails 75 via elastic members 74 respectively. The two rails 75 are fixed to the floor F. At this time, preferably, the rails 75 are rigidly coupled to the floor F. The two rails 75 are also supporting the magnet 21 for generating a static magnetic field.

A bore defined by the inner cylinder 24 and the inner circumferential surface 21*in* of the magnet 21 is sealed airtightly using a vacuum cover 76 whose section in the axial direction are shaped substantially like a bracket with vacuum sealing members 77 and 78 interposed between the vacuum cover 76 and the magnet and inner cylinder. The vacuum bellows 50 are placed in a gap between the vacuum cover 76 and the base 43 of the support assembly 40A.

Owing to the foregoing structure, a solid-propagation path along which vibrations propagate from the gradient coil unit 23 to the magnet 21 is routed to the floor once due to the placement of the support assembly 40A, and is therefor detoured farther than that in a known system. An effect of noise insulation exerted by the vacuum space CS as well as an effect of vibration attenuation exerted by the detoured solid-propagation path are made available. Noises can therefore be reduced more efficiently than those in the known system. In a known system in which a gradient coil unit is supported by the inner circumferential surface or flank of a magnet for generating a static magnetic field, the gradient coil unit 23 is linked to the magnet 21 by a very short path. Vibrations made by the gradient coil unit arm solid-borne nearly directly to the magnet. This poses a problem that vibrations made by the magnet are also added to a noise source. However, despite the employment of a gantry whose supporting structure is relatively simplified as mentioned above, a noiseless magnetic resonance imaging system free from the problem can be provided. When the rails are rigidly coupled to the floor F, as mentioned above, attenuation of vibrations due to the mass effect of the floor works in combination. The noiselessness is further upgraded.

Even when the elastic members 74 are interposed between the rails 75 and floor F, the same operation and effect as those mentioned above can be obtained.

(Third Embodiment)

Figure 8:
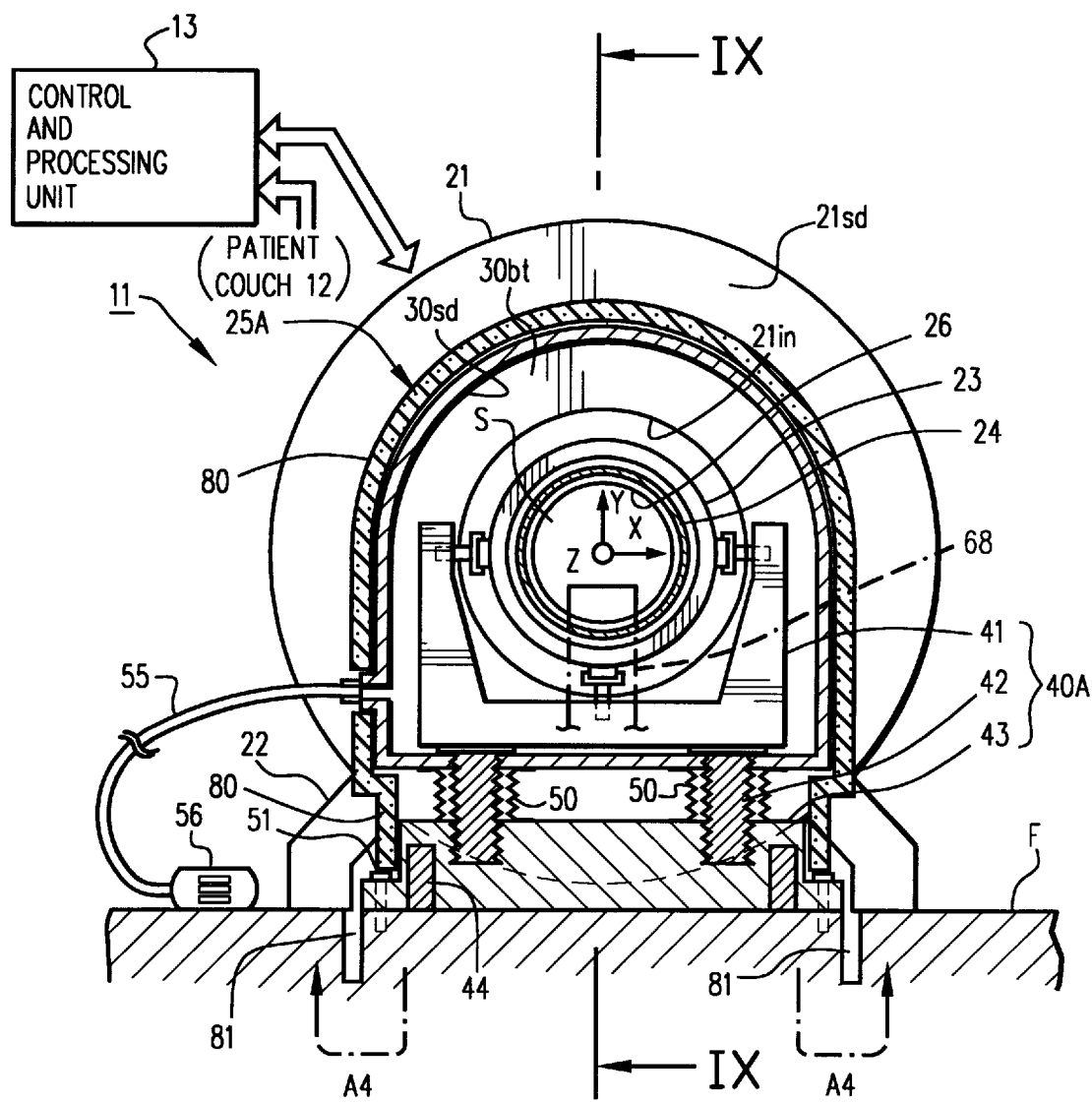
FIG. 8 is a partly-perspective front view showing the structure of a gantry of a magnetic resonance imaging system in accordance with the third embodiment of the present invention.
Figure 9:
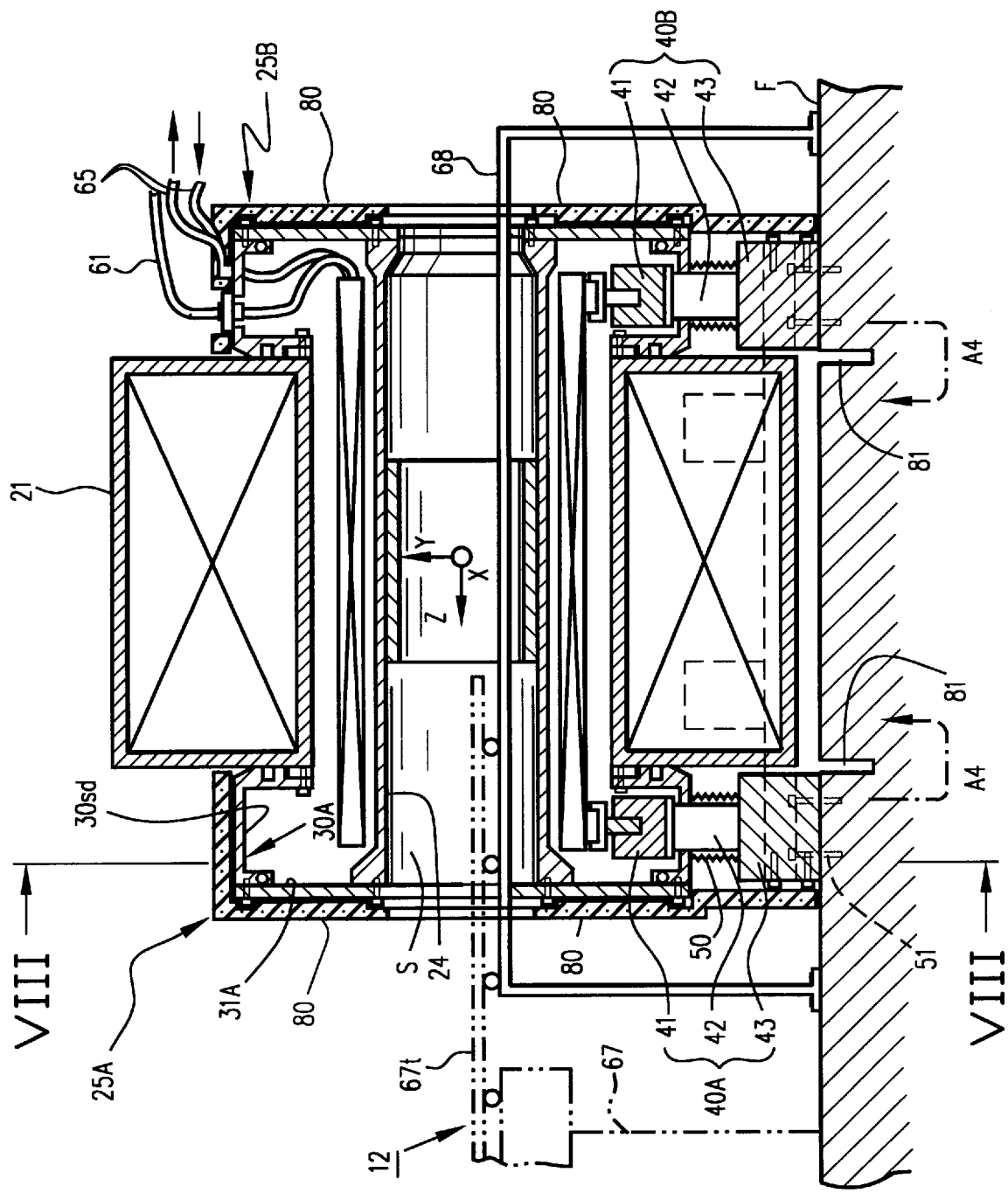
FIG. 9 is a schematic sectional view of the gantry along a IX—IX line in FIG. 8 showing the structure of the gantry.

A magnetic resonance imaging system of the third embodiment will be described in conjunction with FIGS. 8 and 9.

An object of the magnetic resonance imaging system of this embodiment is to provide a greater effect of noise reduction than that provided by the magnetic resonance imaging system of the first embodiment. For accomplishing the object, the gantry 11 shown in FIGS. 8 and 9 includes, in addition to the same components as those in the first embodiment, another noise reduction mechanism.

The main unit of the gantry 11 in identical to that shown in FIGS. 1 and 2. In addition, a noise absorbing material (noise insulating material) 80 is affixed to the outer surfaces of the vacuum covers 25A and 25B and the bases 43 of the support assemblies 40A and 40B. As the noise absorbing material, for example, a urethane material or sponge material is used. The thickness of the noise absorbing material is specified appropriately. The portions of the vacuum covers 25A and 25B, vacuum bellows 50, and bases 43 exposed to the air are covered with the noise absorbing material 80. A few noises (vibrations) leaking out via the exposed portions can be absorbed reliably.

On the floor F, grooves 81 having a given depth are bored for separating the grounded regions of the support assemblies 40A and 40B from the grounded regions of the magnet 21 for generating a static magnetic field. The grounded regions of the support assemblies 40A and 40B and the grounded regions of the magnet 21 are separated by a certain distance. A path linking the grounded region of a support assembly and the one of the magnet is, as indicated with an arrow A4 in FIG. 8, further detoured. Consequently, vibrations are propagated to the floor F after solid-borne to the support assemblies 40A and 40B, and eventually absorbed due to the mass effect of the floor F. Even if vibrations remain unabsorbed, the vibrations do not propagate to the magnet 21 unless they pass along the longer propagation path A4. While the vibrations are propagating along the long propagation path A4, they further attenuate. Eventually, almost all the vibrations are absorbed by the floor F but are not propagated to the magnet 21.

As mentioned above, in addition to the components in the first embodiment, a mechanism is included for more finely suppressing propagation of vibrations in the air and propagation of vibrations to a magnet for generating a static magnetic field. Induction of noises by drive of a gradient coil unit can be suppressed more reliably than that in the first embodiment.

Affixation of the noise absorbing material and formation of the grooves in the floor can be successfully implemented in the gantry in the second embodiment (FIGS. 4 and 5).

Moreover, the grooves bored in the floor may not be left with air therein but may be filled with a noise absorbing material or an elastic member for absorbing vibrations. The region of the floor on which a magnet for generating a static magnetic field is installed may be constructed as a vibration-free floor independent of the region thereof to which the support assemblies are fixed.

(Fourth Embodiment)

Figure 10:
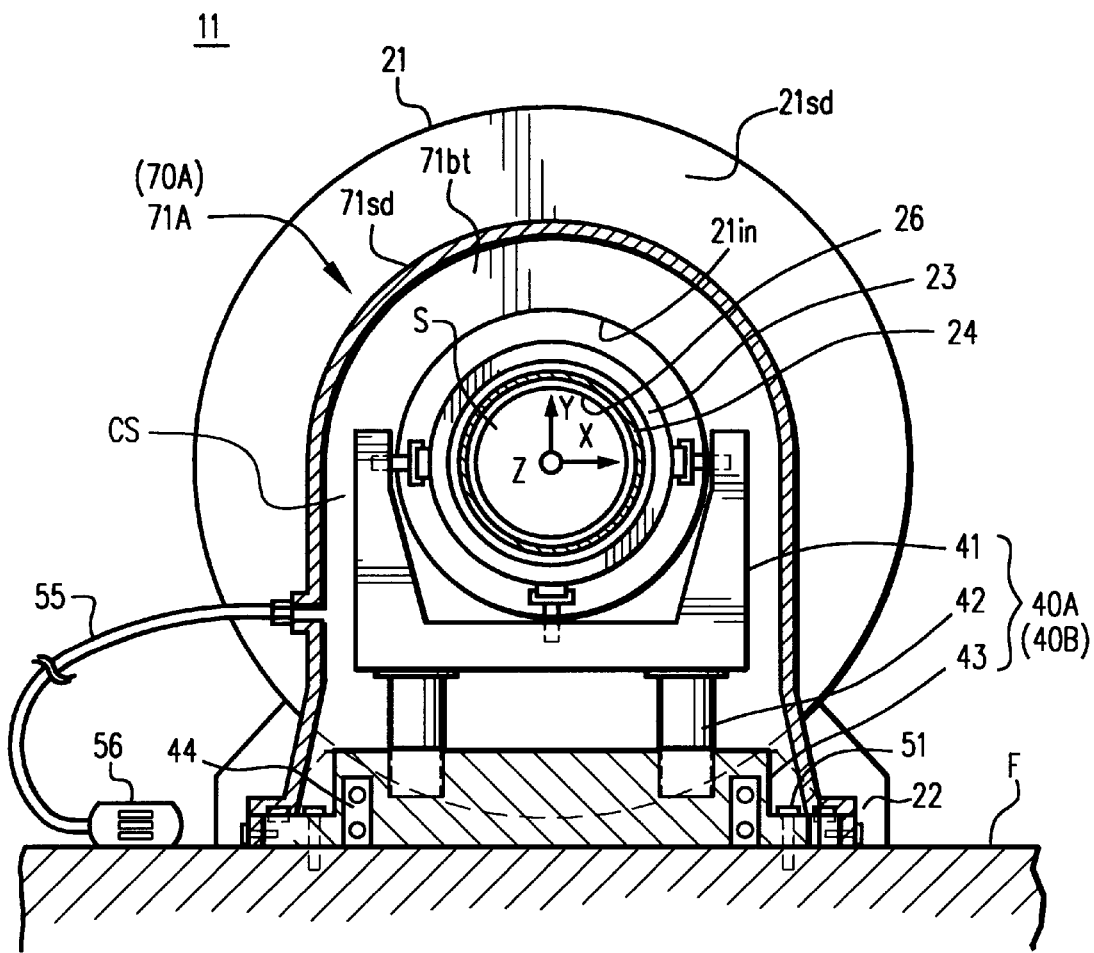
FIG. 10 is a partly-perspective front view showing the structure of a gantry of a magnetic resonance imaging system in accordance with the fourth embodiment of the present invention.

A magnetic resonance imaging system of the fourth embodiment will be described in conjunction with FIG. 10.

In the gantry 11 of the magnetic resonance imaging system, as illustrated, a vacuum cover 70A composed of a flange and vacuum end plate has a skirt thereof extended and has the extended end of the skirt coupled airtightly to components located near the lower sides of the base 43 of the support assembly 40A. A vacuum cover located at the other and in the Z-axis direction of the gantry has the same structure.

The closed space CS exhausted to a vacuum accommodates not only the gradient coil unit 23 but also the support assemblies 40A and 40B at both ends of the gradient coil unit. This obviates the necessity of the aforesaid vacuum bellows. Parts that vibrate most strongly can all be accommodated in the vacuum space, whereby a great effect of noise insulation can be exerted. At the same time, an effect of vibration absorption resulting from rigid coupling of the support assemblies to the floor can be exerted. Even from this viewpoint, a magnetic resonance imaging system excellent in noiselessness can be provided.

(Fifth embodiment)

Figure 11:
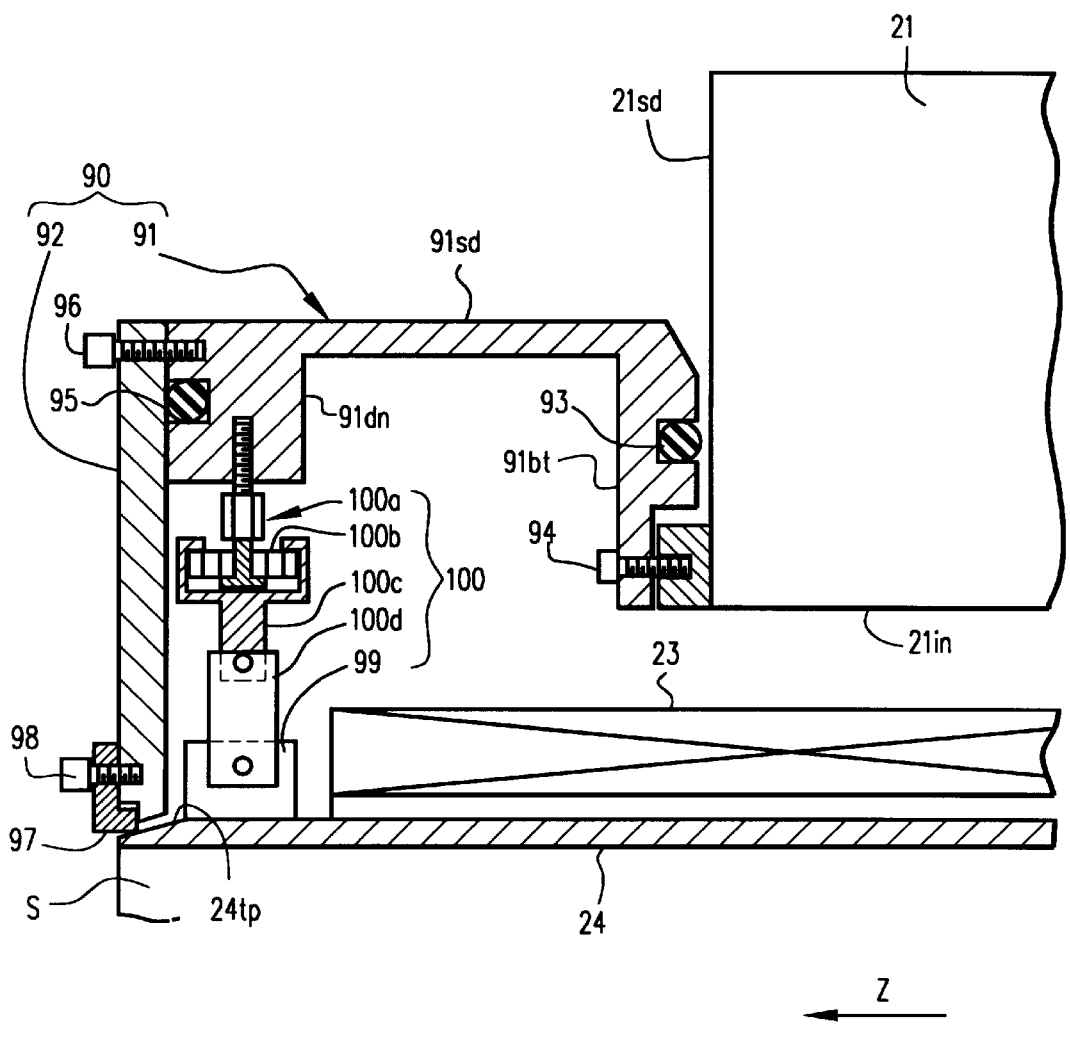
FIG. 11 is a partly-perspective partial front view showing the structure of a gantry of a magnetic resonance imaging system in accordance with the fifth embodiment of the present invention.

A magnetic resonance imaging system of the fifth embodiment will be described in conjunction with FIG. 11. This embodiment is intended to fulfill the aforesaid coupling mechanism for coupling the vacuum covers to the inner cylinder. FIG. 11 shows such a coupling mechanism alone located at one end in the Z-axis direction of the gantry.

As shown in FIG. 11 the gantry of the magnetic resonance imaging system in accordance with the present invention includes a vacuum cover 90 for closing the gap between the inner circumferential surface 21in of the magnet 21 for generating a static magnetic field and the inner cylinder 24. The vacuum cover 90 includes a flange 91 and vacuum end plate 92. The flange 91 is composed of a base member 91bt to be airtightly attached to the flank 21sd of the magnet 21 and a side member 91sd united with the base member. The section in the Z-axis direction of the flange 91 is shaped like a letter L. The base member 91bt is airtightly attached to the flank 21sd by a setscrew 94 with a vacuum sealing member 93 between them.

A step 91dn is formed as an integral part at the distal end of the side member 91sd. The outer circumferential end of the vacuum end plate 92 is attached airtightly to the step 91dn by means of a setscrew 96 with a vacuum sealing member 95 between them. The inner circumferential end of the vacuum and plate 92 is abutted on a tapered and 24tp of the inner cylinder 24 via a vacuum sealing member 97 whose elastic constant is relatively small, and fastened using a setscrew 98. The fastening is intended mainly to assist the vacuum sealing member 97 in achieving sealing. Bearing the weight of the inner cylinder 24 is assigned to a supporting mechanism to be described later. The vacuum seeing member 97 attached to the tapered end 24tp is structured so that even when the vacuum end plate 92 is moved in the Z-axis direction within a given range, the vacuum sealing member can absorb the movement in cooperation with the tapered end. Thus, even when the length in the center-axis (Z-axis) direction of the magnet 21 is manufactured to be different from that of another magnet, a good affect of sealing can be obtained irrespective of the difference.

Furthermore, a plate-like stopper 99 is jutting in the vicinity of the taped end 24tp of the inner cylinder. The stopper 99 and step 91dn are opposed to each other. A inner-cylinder suspending mechanism 100 whose vertical position (Y-axis direction) can be adjusted is interposed between the stopper 99 and step 91dn. The inner-cylinder suspending mechanism 100 includes an upper suspender 100a whose one end is attached to the step 91dn and whose vertical position can be adjusted by rotating it, a torus-like elastic member 100b through which the other and of the upper suspender 100a is penetrated so that the upper suspender can be locked by the elastic member, a lower suspender 100c having one and thereof engaged with the outer circumference of the elastic member 100b, and a connector 100d for linking the other end of the lower suspender 100c and the stopper 99.

The elastic member 100b bears almost the whole weight of the vacuum cover 90 that is, almost all the weights of components and parts linking the magnet 21 and the inner cylinder 24 owing to a shearing stress. Since the elastic member 100b is included, solid vibrations to be propagated from the magnet 21 to the cylinder 24 can be reduced. Moreover, since almost the whole weight of the inner cylinder 24 is borne by the inner-cylinder suspending mechanism 100, the elastic constant of the vacuum sealing member 97 can be made smaller. Eventually, solid propagation of vibrations from the magnet 21 through the vacuum cover to the inner cylinder 24 can be reduced. Moreover, in the case of this structure, the elastic constant of the elastic member 100b for supporting the inner cylinder is much smaller than that of the first elastic member 45c bearing the weight of the gradient coil unit shown in FIG. 1 that has been referred to previously. In other words, solid-borne vibrations passing through the inner-cylinder suspending mechanism 100 can be greatly limited.

As mentioned above, owing to the structure for not propagating vibrations from the magnet 21 to the inner cylinder 24 as greatly as possible, not only vibrations caused by vibrations stemming from the gradient coil unit 23 but also vibrations induced by drive of the magnet 21 itself can be suppressed. Consequently, vibrations made by the inner cylinder 24 that is structurally hard to affix a noise absorbing material or the like and is therefore bared can be suppressed, and occurrence of noises can be prevented.

[Second Variant]

Figure 12:
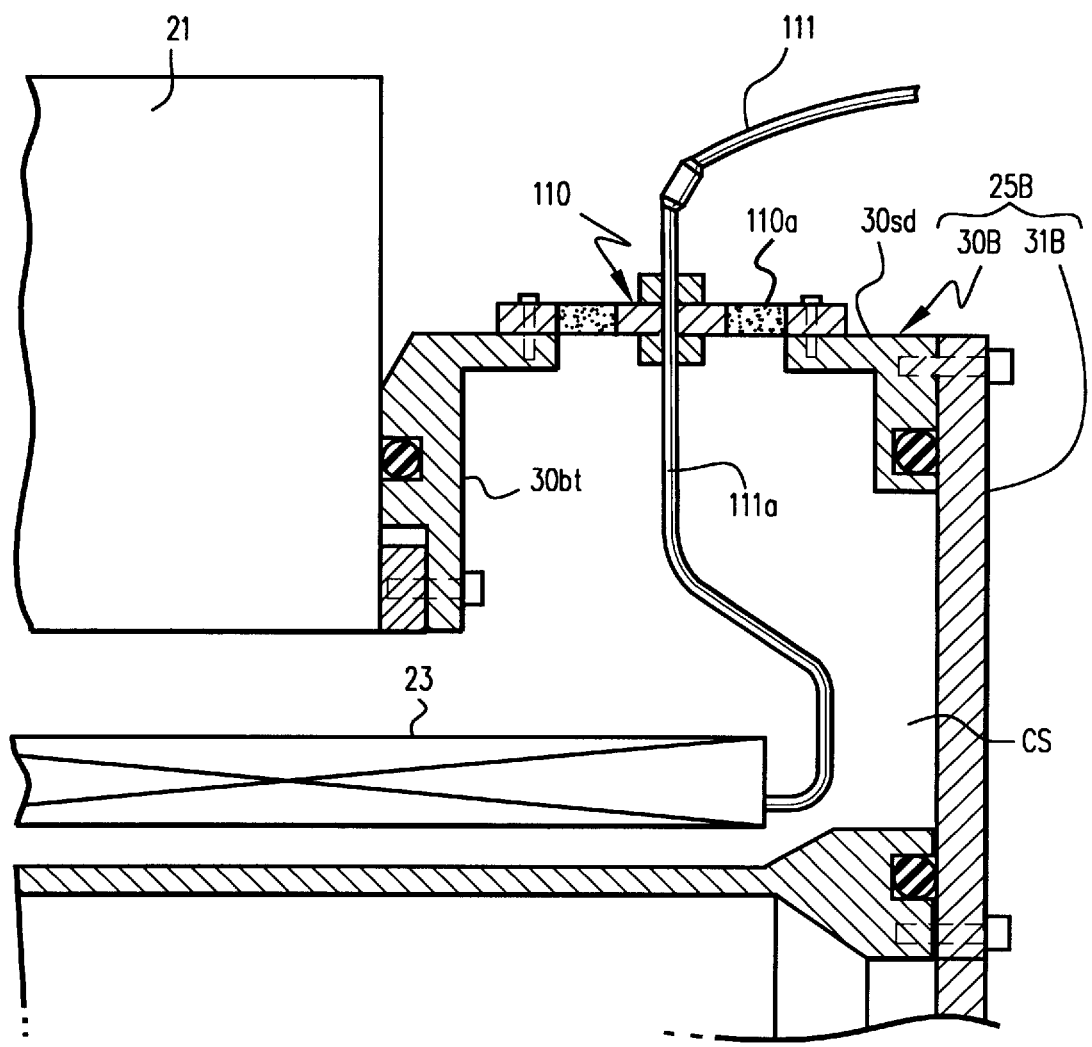
FIG. 12 is a partial sectional view showing a power cable led into a gantry in accordance with the second variant.

A variant will be described in conjunction with FIG. 12. FIG. 12 shows an example of a power cable led into the gradient coil unit 23. A relay terminal 110 having the ability to insulate vibrations owing to inclusion of an elastic member 110a having flexibility and the ability to withstand a vacuum is attached to the flange 30B of the vacuum cover 25B. A power cable 111 is led into the vacuum space CS via the relay terminal 110. The power cable 111 is structured as an inner power cable 111a, which is made by coating a bendable conductor (for example, a mesh conductor) with an electrically insulating material, at least in the vacuum space CS.

The inner power cable 111a is linked to the gradient coil unit 23. Vibrations propagating from the gradient coil unit 23 to the vacuum cover 25B over the inner power cable 111a are therefore reduced drastically. Furthermore, the elastic member 110a of the relay terminal 110 further facilitates suppression of vibration propagation. Moreover, since the inner cable 111a has the conductor thereof coated with an electrically insulating material, a discharge phenomenon can be prevented reliably.

[Third Variant]

Figure 13:
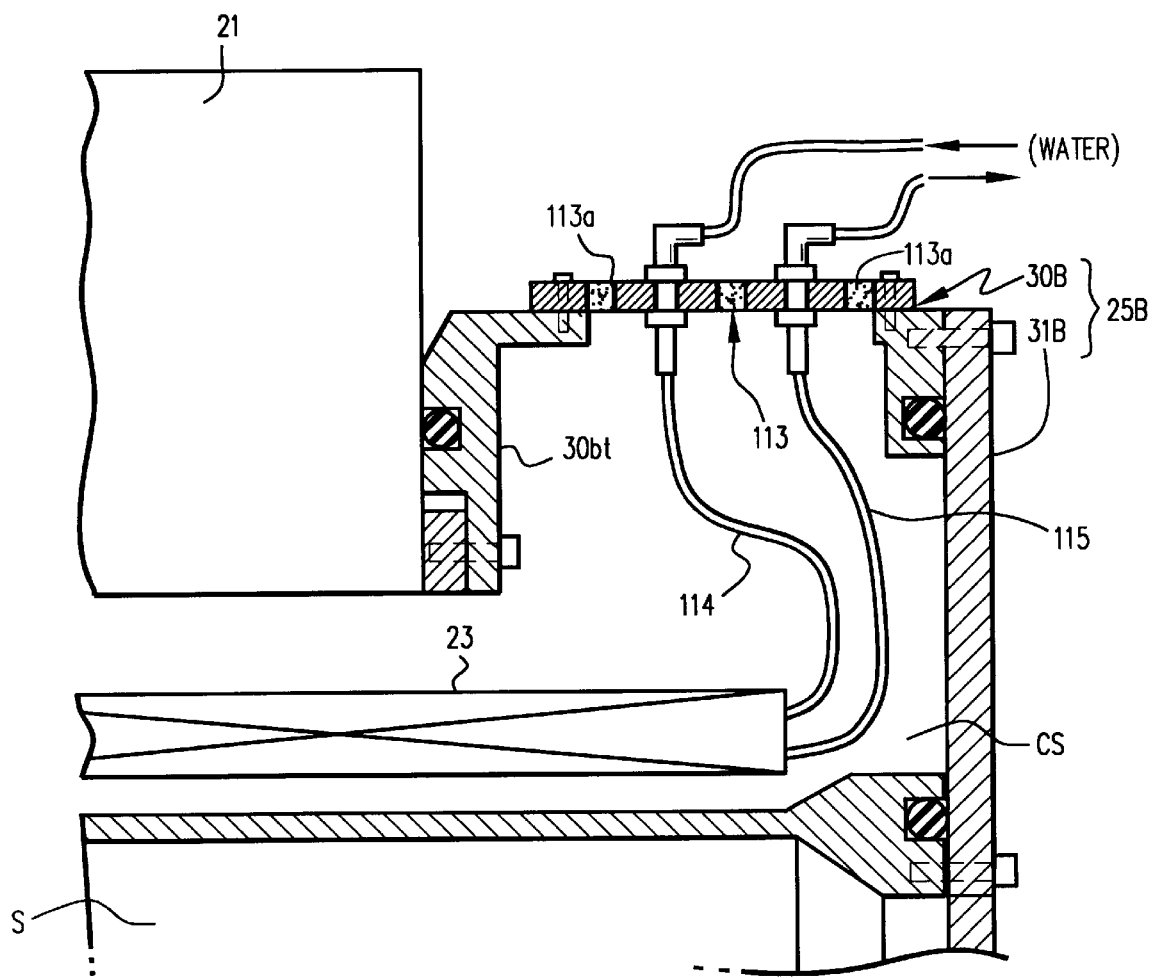
FIG. 13 is a partial sectional view showing cooling medium tubes routed into a gantry in accordance with the third variant.

Another variant will be described in conjunction with FIG. 13. FIG. 13 shows an example of cooling tubes led into the gradient coil unit 23. A two-port coupler 113 having the ability to insulate vibrations owing to inclusion of an elastic member 113a having flexibility and the ability to withstand a vacuum is attached to the flange 30B of the vacuum cover 25B. Tubes 114 and 115 go and return between the vacuum space CS and external world by way of the coupler 113. Vibrations propagating from the gradient coil unit 23 to the vacuum cover 25B over the tubes 114 and 115 are reduced owing to the elastic member 113a of the coupler 113.

[Fourth Variant]

Figure 14:
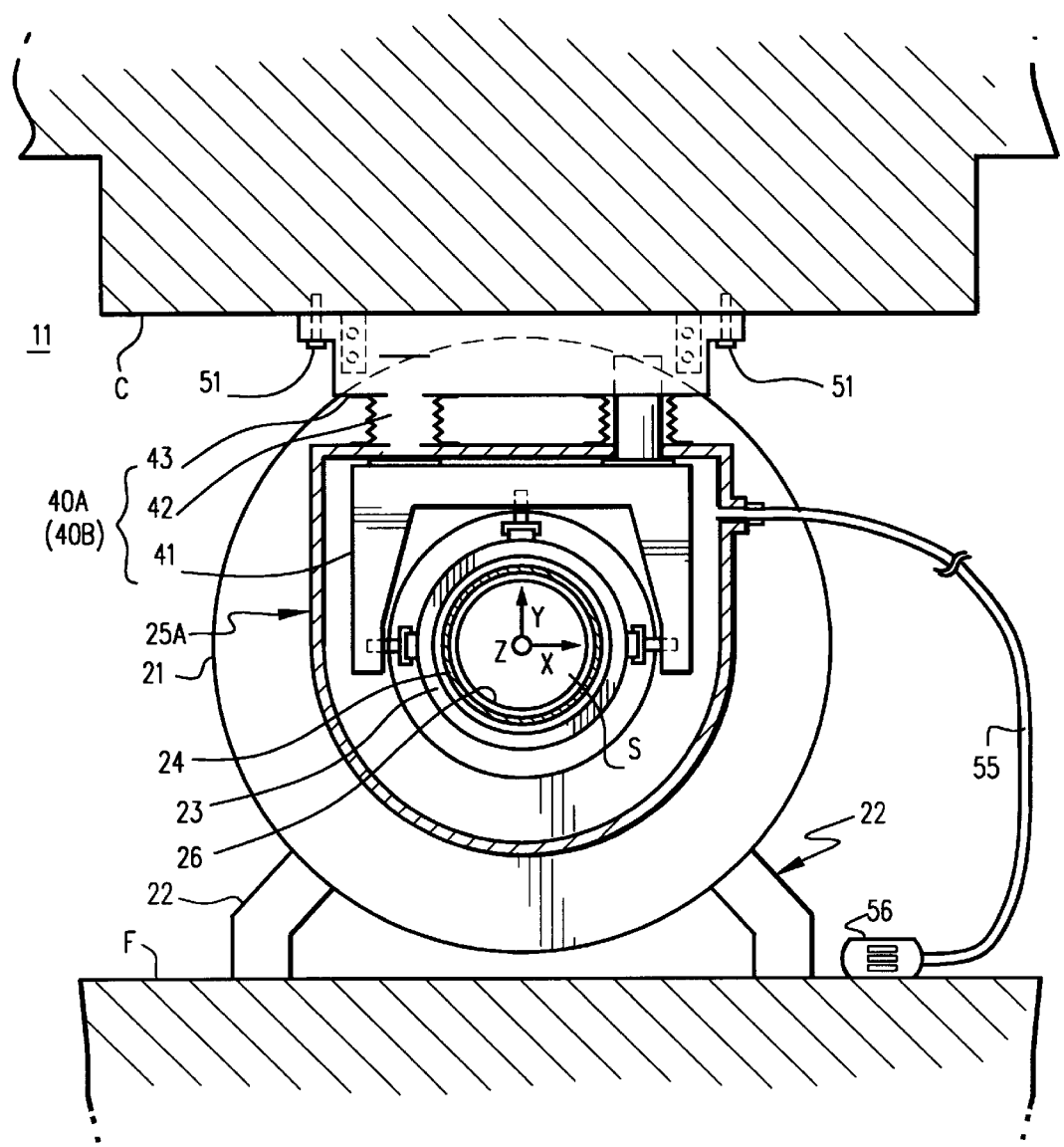
FIG. 14 is a partial sectional view showing the way of supporting a gantry using both the floor and ceiling in accordance with the fourth variant.

FIG. 14 shows yet another variant. The illustrated gantry 11 has the same components as the one shown in FIG. 1. However, instead of the floor F, a ceiling C is used as an installation place on which the support assemblies 40A and 40B for supporting the gradient coil unit 23 are placed. Specifically, the magnet 21 for generating a static magnetic field is installed on the floor F in the same manner as that described previously. However, the gradient coil unit 23 is suspended from the ceiling C via the support assemblies 40A and 40B. The ceiling C is designed to exhibit high rigidity. The support assemblies 40A and 40B are rigidly coupled to the ceiling C using the anchor bolts 51.

In this case, therefore, the operation of vibration attenuation derived from a mass effect exerted by the ceiling C can be obtained. Moreover, since the floor F (on which the magnet is installed) and the ceiling C (from which the gradient coil unit is suspended) which are installation places hardly affected by vibrations are separated from each other, solid propagation of vibrations on the installation places can be blocked nearly perfectly. Eventually, a noiseless gantry having noises reduced greatly can be provided.

A described so far, a gantry has a structure including a means for retaining a magnetic field gradient generating means in a mechanically uncoupled or substantially uncoupled state relative to a static magnetic field generating means, and supporting the magnetic field gradient generating means above an installation place, and a means for defining a closed space around at least the magnetic field gradient generating means, and bringing the closed space to a vacuum state. This results in a noiseless magnetic resonance imaging system in which solid-borne vibrations propagating from a gradient coil unit through the magnetic field gradient supporting means to a magnet are reduced markedly, airborne vibrations stemming from the gradient coil unit can be cut off, and noises (vibrations) occurring in the whole gantry are suppressed to a very low level.

According to another aspect, a gantry has a structure including a means for retaining a magnetic field gradient generating means and static magnetic field generating means in a mechanically uncoupled or substantially uncoupled state and supporting both the magnetic field generating means separately above an installation place, and a means for rigidly coupling these means to the installation place. Vibration attenuation due to a mass effect exerted by the installation place such as a floor can be utilized actively, solid-borne vibrations propagating from the gradient coil unit to the magnetic field gradient supporting means can be reduced markedly, and noises (vibrations) occurring in the whole gantry can be suppressed successfully.

Numerous modifications and variations of the invention will be apparent to those skilled in the art in view of the foregoing description. Thus, it is to be understood that, within the scope of the appended claims, the invention may be practiced other than as specifically described hereinabove.

What is claimed is:

1. A magnetic resonance imaging system having a gantry comprising:
    static field generating means for generating a static magnetic field in a scanning region defined in a diagnostic space into which an object to be imaged is inserted;
    gradient generating means for generating a magnetic field gradient in the scanning region;
    supporting means for supporting the gradient generating means in a condition where the weight of the gradient generating means is substantially not applied to the static field generating means; and
    vacuum space creating means for not only defining a closed space located around at least the gradient generating means but also bringing the closed space into a vacuum state.

2. The system of claim 1, wherein the static field generating means comprises a magnet not only generating the static magnetic field but also having the diagnostic space and the gradient generating means comprises gradient coils generating the magnetic field gradient.

3. The system of claim 2, wherein the vacuum space creating means comprises a space-defining element for defining the closed space located around at least an assembly of the gradient coils, the space-defining element being rigidly uncoupled with the gradient generating means.

4. The system of claim 1, wherein the supporting means is constructed so as to support only an approximately total weight of the gradient generating means at the installation place independently from the static field generating means.

5. The system of claim 1, wherein the supporting means are composed of members supporting the gradient generating means in a substantially mechanically-uncoupled condition to the static field generating means at an installation place of the system.

6. A magnetic resonance imaging system having a gantry comprising:

static field generating means for generating a static magnetic field in a scanning area in a diagnostic space;

gradient generating means for generating a magnetic field gradient in the scanning area;

supporting means for retaining the gradient generating means in a substantially-uncoupled state relative to the static field generating means and supporting the gradient generating means on an installation place; and vacuum space creating means for defining a closed space around at least the gradient generating means and bringing the closed space to a vacuum state, whereby noises derived from drive of the gradient generating means are suppressed;

wherein the static field generating means comprises a magnet generating the static magnetic field and the gradient generating means comprises gradient coils generating the magnetic field gradient;

wherein the vacuum space creating means comprises a space-defining element for defining the closed space around at least the gradient coils, the space-defining element being rigidly uncoupled with the gradient generating means; and wherein the vacuum space creating means comprises pumping means for exhausting gas from the closed space.

7. The system of claim 6, wherein the magnet has axial and radial directions and the assembly of the gradient coils are composed of x-coils, y-coils, and z-coils generating gradients serving as the magnetic field gradient in a mutually-orthogonal X-, Y-, Z-directions set with respect to the gantry.

8. The system of claim 7, wherein the supporting means comprises a single pair of supporting elements individually supporting the gradient coils at both sides of the magnet in the axial direction thereof, wherein each supporting element comprises a supporting member retaining the gradient coils, a rod member supporting the supporting member, and a base member supporting the rod member erected on the installation place.

9. A magnetic resonance imaging system having a gantry comprising:

static field generating means for generating a static magnetic field in a scanning area in a diagnostic space;

gradient generating means for generating a magnetic field gradient in the scanning area;

supporting means for retaining the gradient generating means in a substantially-uncoupled state relative to the static field generating means and supporting the gradient generating means on an installation place; and vacuum space creating means for defining a closed space around at least the gradient generating means and bringing the closed space to a vacuum state, whereby noises derived from drive of the gradient generating means are suppressed;

wherein the static field generating means comprises a magnet generating the static magnetic field and the gradient generating means comprises gradient coils generating the magnetic field gradient;

wherein the vacuum space creating means comprises a space-defining element for defining the closed space around at least the gradient coils, the space-defining element being rigidly uncoupled with the gradient generating means; and means for rigidly coupling the supporting means with an object on which the system is installed at the installation place.

10. A magnetic resonance imaging system having a gantry comprising:

static field generating means for generating a static magnetic field in a scanning area in a diagnostic space;

gradient generating means for generating a magnetic field gradient in the scanning area;

supporting means for retaining the gradient generating means in a substantially-uncoupled state relative to the static field generating means and supporting the gradient generating means on an installation place; and vacuum space creating means for defining a closed space around at least the gradient generating means and bringing the closed space to a vacuum state, whereby noises derived from drive of the gradient generating means are suppressed;

wherein the supporting means is constructed such that the supporting means supports the gradient generating means in a state where weight of the gradient generating means is substantially not applied to the static field generating means.

11. A magnetic resonance imaging system having a gantry comprising:

static field generating means for generating a static magnetic field in a scanning area in a diagnostic space;

gradient generating means for generating a magnetic field gradient in the scanning area;

supporting means for retaining the gradient generating means in a substantially-uncoupled state relative to the static field generating means and supporting the gradient generating means on an installation place; and vacuum space creating means for defining a closed space around at least the gradient generating means and bringing the closed space to a vacuum state, whereby noises derived from drive of the gradient generating means are suppressed;

wherein the supporting means is constructed so as to support the gradient generating means differently in configuration of physical structures from the static field generating means.

12. A magnetic resonance imaging system having a gantry comprising:

static field generating means for generating a static magnetic field in a scanning region defined in a diagnostic space into which an object to be imaged is inserted;

first supporting means for supporting the static field generating means at a position on an installation place of the system;

gradient generating means for generating a magnetic field gradient in the scanning region; and second supporting means for supporting the gradient generating means at another position different from the supported position of the static field generating means on the installation place in a condition where the weight of the gradient generating means is substantially not applied to the static field generating means.

13. The system of claim 12, further comprising coupling means for rigidly coupling the second supporting means with an object on which the system is installed at the installation place.

14. The system of claim 13, wherein the static field generating means comprises a magnet generating the static magnetic field and having axial and radial directions and the gradient generating means comprises gradient coils composed of x-coils, y-coils, and z-coils generating gradients serving as the magnetic field gradient in a mutually-orthogonal X-, Y-, Z-directions set with respect to the gantry.

15. The system of claim 13, comprising a space-defining element for defining a closed space located around at least the gradient coils and pumping means for exhausting gas from the closed space.

16. The system of claim 15, wherein the second supporting means comprises a single pair of supporting elements individually supporting the gradient coils at both sides of the magnet in the axial direction thereof, wherein each supporting element comprises a supporting member retaining the gradient coils, a rod member supporting the supporting member, and base member supporting the rod member at the installation place.

17. The system of claim 14, wherein the coupling means is an anchoring element rigidly coupling the second supporting means to a rigid floor providing the object on which the system is installed at the installation place.

18. A magnetic resonance imaging system having a gantry comprising:

static field generating means for generating a static magnetic field in a scanning area in a diagnostic space;

first supporting means for supporting the static field generating means at a position on an installation place;

gradient generating means for generating a magnetic field gradient in the scanning area;

second supporting means for retaining the gradient generating means in a substantially uncoupled state with respect to the static field generating means and supporting the gradient generating means at another position different from the supporting position of the static field generating means on the installation place; and coupling means for rigidly coupling the second supporting means to the installation place, whereby noises derived from drive of the gradient generating means are suppressed;

wherein the static field generating means comprises a magnet generating the static magnetic field and having an axial and radial directions and the gradient generating means comprises gradient coils composed of x-coils, y-coils, and z-coils generating gradients as the magnetic field gradient in an X-, Y-, Z-directions set in the gantry;

a space-defining element for defining a closed space around at least the gradient coils and pumping means for exhausting gas from the closed space;

wherein the second supporting means comprises a single pair of supporting elements individually supporting the gradient coils at both sides of the magnet in the axial direction thereof, wherein each supporting element comprises a supporting member retaining the gradient coils, a rod member supporting the supporting member, and a base member supporting the rod member on the installation place; and wherein the space-defining element has a configuration including at least part of the members of the second supporting means.

19. The system of claim 18, wherein the part of the members comprises the supporting member and the rod member of each supporting element.

20. The system of claim 19, wherein the space-defining element has an inner cylinder defining part of the diagnostic space by positioning the inner cylinder so as to be positioned in the order of the inner cylinder, the gradient coils, and the magnet in the radial direction of the gantry, a cover element airtightly covering an aperture formed between the cylinder and the magnet, and a sealing element airtightly sealing a gap formed between the cover element and each supporting element.

21. The system of claim 20, wherein the sealing element is formed of a vacuum-proof material of low rigidity.

22. The system of claim 21, wherein the sealing element comprises vacuum bellows.

23. The system of claim 20, wherein an outer surface of the cover element is at least partially covered by noise absorbing material.

24. The system of claim 20, wherein the cover element comprises a flange having two ends, one end being tightly attached to a flank in the axial direction of the magnet, and an end plate tightly covering an aperture formed between the other end and each axial end of the inner cylinder.

25. The system of claim 24, wherein the flank of the magnet is shaped perpendicularly to the axial direction thereof, and one end of the flange is airtightly movable along the flank.

26. The system of claim 24 wherein the flange and end plate are coupled with each other via a vacuum sealing member whose position is adjustable in the radial direction.

27. The system of claim 24, wherein the end plate and inner cylinder are coupled with each other via a vacuum sealing member whose position is adjustable in the axial direction.

28. The system of claim 20, comprising a suspending element suspending and supporting the inner cylinder from the cover element.

29. The system of claim 28, wherein the suspending element has a support whose ends are coupled with the cover element and inner cylinder respectively and whose length is adjustable, and an elastic member inserted into the support so as to divide the support into two parts.

30. The system of claim 29, wherein the second supporting means comprises another elastic element intervening between the supporting member and a unit incorporating the gradient coils and supporting weight of the unit, another elastic element being greater in elastic constant than the elastic element.

31. The system of claim 20, wherein the cover element is provided with at least one of relay members relaying a power line and a cooling tube airtightly passed through the cover element, the power cable supplying current to the gradient coils and the cooling tube supplying a cooling medium to a unit incorporating the gradient coils therein.

32. The system of claim 31, wherein the relay member has a vibration insulation terminal having flexibility and vacuum-proof performance.

33. The system of claim 31, wherein the power cable is formed into a flexible cable in the vacuum space, the flexible cable being covered by an electric insulation material.

34. The system of claim 33, wherein the cooling tube in formed of vacuum-proof material having flexibility in the vacuum space.

35. A magnetic resonance imaging system having a gantry comprising:

static field generating means for generating a static magnetic field in a scanning area in a diagnostic space;

first supporting means for supporting the static field generating means at a position on an installation place;

gradient generating means for generating a magnetic field gradient in the scanning area;

second supporting means for retaining the gradient generating means in a substantially uncoupled state with respect to the static field generating means and supporting the gradient generating means at another position different from the supporting position of the static field generating means on the installation place; and coupling means for rigidly coupling the second supporting means to the installation place, whereby noises derived from drive of the gradient generating means are suppressed;

wherein the static field generating means comprises a magnet generating the static magnetic field and having an axial and radial directions and the gradient generating means comprises gradient coils composed of x-coils, y-coils, and z-coils generating gradients as the magnetic field gradient in an X-, Y-, Z-directions set in the gantry;

wherein the coupling means comprises an anchoring element rigidly coupling the second supporting means to a rigid floor formed as the installation place; and wherein the second supporting means comprises a single pair of supporting elements individually supporting the gradient coils at both sides of the magnet in the axial direction thereof, wherein each supporting element comprises a base member paced on the installation place, both the base members positioned at both the sides of the magnet in the axial direction thereof being coupled with each other by a coupling element having high rigidity.

36. A magnetic resonance imaging system having a gantry comprising:

static field generating means for generating a static magnetic field in a scanning area in a diagnostic space;

first supporting means for supporting the static field generating means at a position on an installation place;

gradient generating means for generating a magnetic field gradient in the scanning area;

second supporting means for retaining the gradient generating means in a substantially uncoupled state with respect to the static field generating means and supporting the gradient generating means at another position different from the supporting position of the static field generating means on the installation place; and coupling means for rigidly coupling the second supporting means to the installation place, whereby noises derived from drive of the gradient generating means are suppressed;

wherein the static field generating means comprises a magnet generating the static magnetic field and having an axial and radial directions and the gradient generating means comprises gradient coils composed of x-coils, y-coils, and z-coils generating gradients as the magnetic field gradient in an X-, Y-, Z-directions set in the gantry;

wherein the coupling means comprises an anchoring element rigidly coupling the second supporting means to a rigid floor formed as the installation place; and wherein the second supporting means comprises a single pair of supporting elements individually supporting the gradient coils at both sides of the magnet in the axial direction thereof, wherein each supporting element comprises a position adjusting element whose spatial position is adjustable in a horizontal and vertical direction, thereby spatial positions of the gradient coils being adjustable in the horizontal and vertical positions.

37. The system of claim 36, wherein each supporting element is provided with at least one of relay members relaying a power line and a cooling tube airtightly passed through the cover element, the power cable supplying current to the gradient coils and the cooling tube supplying a cooling medium to a unit incorporating the gradient coils therein.

38. A magnetic resonance imaging system having a gantry comprising:

static field generating means for generating a static magnetic field in a scanning area in a diagnostic space;

first supporting means for supporting the static field generating means at a position on an installation place;

gradient generating means for generating a magnetic field gradient in the scanning area;

second supporting means for retaining the gradient generating means in a substantially uncoupled state with respect to the static field generating means and supporting the gradient generating means at another position different from the supporting position of the static field generating means on the installation place; and coupling means for rigidly coupling the second supporting means to the installation place, whereby noises derived from drive of the gradient generating means are suppressed;

wherein the static field generating means comprises a magnet generating the static magnetic field and having an axial and radial directions and the gradient generating means comprises gradient coils composed of x-coils, y-coils and z-coils generating gradients as the magnetic field gradient in an X-, Y-, Z-directions set in the gantry;

wherein the coupling, means comprises an anchoring element rigidly coupling the second supporting means to a rigid floor formed as the installation place; and wherein the second supporting means comprises a single pair of supporting elements individually supporting the gradient coils at both sides of the magnet in the axial direction thereof, wherein each supporting means comprises a supporting member retaining an approximately cylindrical unit incorporating the gradient coils therein, and a first elastic member intervening between the supporting member and the unit of the gradient coils and being weighted by weight of the unit.

39. The system of claim 38, wherein the first elastic element is positioned at a desired position on an outer and approximate lower-side circumferential surface of the unit under operation.

40. The system of claim 39, wherein each supporting element comprises a vertical position adjusting member intervening between the supporting member and the first elastic member and adjusting a vertical directional position of the unit.

41. The system of claim 38, wherein each supporting element comprises a lateral position adjusting member having a second elastic member intervening between the supporting member and the unit of the gradient coils and adjusting a lateral directional position of the unit.

42. The system of claim 41, wherein the second elastic element has a smaller elastic constant than the first elastic element.

43. The system of claim 42, wherein each supporting member is configured into a three-point retaining structure in which a lower part of the unit is retained by both the first elastic member and the vertical position adjusting member and each of side parts of the unit in retained by both the second elastic member and the lateral position adjusting member.

44. A magnetic resonance imaging system having a gantry comprising:

static field generating means for generating a static magnetic field in a scanning area in a diagnostic space;

first supporting means for supporting the static field generating means at a position on an installation place;

gradient generating means for generating a magnetic field gradient in the scanning area;

second supporting means for retaining the gradient generating means in a substantially uncoupled state with respect to the static field generating means and supporting the gradient generating means at another position different from the supporting position of the static field generating means on the installation place; and coupling means for rigidly coupling the second supporting means to the installation place, whereby noises derived from drive of the gradient generating means are suppressed;

wherein the static field generating means comprises a magnet generating the static magnetic field and having an axial and radial directions and the gradient generating means comprises gradient coils composed of x-coils, y-coils, and z-coils generating gradients as the magnetic field gradient in an X-, Y-, Z-directions set in the gantry;

a space-defining element for defining a closed space around at least the gradient coils and pumping means for exhausting gas from the closed space;

wherein the second supporting means comprises a single pair of supporting elements individually supporting the gradient coils at both sides of the magnet in the axial direction thereof, wherein each supporting element comprises a supporting member retaining the gradient coils, a rod member supporting the supporting member, and a base member supporting the rod member on the installation place; and a patient couch having a tabletop, on which a patient to be diagnosed is laid, slidably inserted into the diagnostic space, and a rail element slidably supporting and guiding the tabletop in the diagnostic space, wherein the rail element and the gantry are disposed on the installation place in with no contact with each other.

45. An MRI system gantry having magnetic gradient coils mounted and supported separately and independently of a static polarizing magnetic field generator.

46. An MRI system gantry as in claim 45 further comprising a vacuum-containing housing disposed about said magnetic gradient coils.

47. An MRI system gantry having magnetic gradient coils mechanically coupled to independently transfer vibrational motion to a larger mass in the vicinity of its installation that is not part of the gantry.

48. An MRI system gantry as in claim 47 wherein said larger mass is part of a building structure at an installation site which also supports the weight of said magnetic gradient coils.

49. An MRI system gantry as in claim 48 further comprising a vacuum-containing housing disposed about said magnetic gradient coils.

* * * * *